(12) United States Patent  
Uchiyama et al.

(10) Patent No.: US 7,064,401 B2  
(45) Date of Patent: Jun. 20, 2006

(54) THIN FILM PIEZOELECTRIC ELEMENT, METHOD OF MANUFACTURING THE SAME, AND ACTUATOR

(75) Inventors: Hirokazu Uchiyama, Osaka (JP); Terumi Yanagi, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 258 days.

(21) Appl. No.: 10/792,930

(22) Filed: Mar. 5, 2004

(65) Prior Publication Data

US 2004/0183403 A1 Sep. 23, 2004

(30) Foreign Application Priority Data

Mar. 6, 2003 (JP) ............... 2003-059962

(51) Int. Cl.
*H01L 29/84* (2006.01)
*G11B 21/24* (2006.01)
*H01L 21/00* (2006.01)
*B23B 5/28* (2006.01)

(52) U.S. Cl. .................. 257/415; 360/294.4; 257/254

(58) Field of Classification Search ............. 257/254, 257/E21.009, E27.006, 415; 360/294.4; 428/615; 427/100
See application file for complete search history.

(56) References Cited

U.S. PATENT DOCUMENTS 6,897,503 B1* 5/2005 Otani et al. ............ 257/295

2003/0155845 A1 8/2003 Uchiyama et al.
2003/0223155 A1 12/2003 Uchiyama
2005/0040454 A1* 2/2005 Kita ..................... 257/310

FOREIGN PATENT DOCUMENTS

| JP | 6-224483 | 8/1994 |
| JP | 7-30163 | 1/1995 |
| JP | 8-88419 | 4/1996 |
| JP | 8-242023 | 9/1996 |
| JP | 11-142753 | 5/1999 |

OTHER PUBLICATIONS

Y. Uematsu, "Switching to super-high TPI and piggy-back actuator", IDEMA Japan News No. 32, pp. 4-7 (with partial translation).

* cited by examiner

*Primary Examiner*—David Nelms
*Assistant Examiner*—Long Tran
(74) *Attorney, Agent, or Firm*—Wenderoth, Lind & Ponack, L.L.P.

(57) ABSTRACT

Two piezoelectric thin films each sandwiched between a main electrode layer and an opposite electrode layer are laminated in pairs so as to form a thin film piezoelectric element. An electrode leading area has a region in which the main electrode layer partially projects from the piezoelectric thin film, and another region in which only an insulating layer is formed on a part of the opposite electrode layer. At least one of a first opening formed through the insulating layer in the former region and a second opening formed through the insulating layer in the latter region is provided. A connection wiring for connecting to the opposite electrode layer or the main electrode layer and leading to the surface layer is formed via the opening.

26 Claims, 15 Drawing Sheets

THIN FILM PIEZOELECTRIC ELEMENT, METHOD OF MANUFACTURING THE SAME, AND ACTUATOR

FIELD OF THE INVENTION

The present invention relates to a thin film piezoelectric element, a method of manufacturing the element, and an actuator using the element.

BACKGROUND OF THE INVENTION

In recent years, efforts have been made to realize micromachinery using technologies for manufacturing semiconductors. Mechanical electric elements, such as an actuator, are getting into the limelight. The use of such elements can realize small and high-precision machinery. Especially examined are applications of an actuator using piezoelectric elements for micro-positioning the head slider of a disk drive.

For instance, in a magnetic disk recording/reproducing device, the magnetic head for recording into or reproducing from a magnetic disk is mounted on the head slider and attached to the actuator arm. This actuator arm is rocked by a voice coil motor (hereinafter referred to as a "VCM") so as to position the magnetic head in a specific track position on the magnetic disk for recording and reproduction. However, with improvements in recording density, a sufficient precision cannot be ensured by such conventional positioning which only use a VCM. For this reason, in addition to the positioning means using a VCM, a technique has been proposed for driving the head slider for high-speed and high-precision positioning with a micro-positioning means using piezoelectric elements. ("Switching to super-high TPI and piggy-back actuator", IDEMA Japan News, International Disk Drive Equipment Material Association Japan, September, 1999, Vol. 32, pp 4–7).

As described above, actuators using piezoelectric elements are expected to find a wide range of applications. As disclosed in Japanese Patent Unexamined Publication No. H06-22448, many of the conventional piezoelectric elements are structured to be laminated by a green sheet lamination method or a thick film multilayer method. However, when the piezoelectric elements are produced by these manufacturing methods, the thickness of one layer of the piezoelectric elements measures several dozens micrometers. Thus, a drive voltage of at least 100V is necessary.

In contrast, Japanese Patent Unexamined Publication No. H08-88419 discloses a thin film laminated actuator which is small and capable of being driven at a low voltage and which has a large amount of displacement, and a method of manufacturing the actuator. The manufacturing method is described hereinafter. First, an electrode layer made of platinum (Pt), aluminum (Al), gold (Au), silver (Ag) or other materials, a piezoelectric layer made of a piezoelectric material including lead zirconium titanate (PZT), lead lanthanum zirconate titanate (PLZT), and an electrode layer made of the above-mentioned material are formed on a single-crystal substrate made of magnesium oxide (MgO), strontium titanate ($SrTiO_3$), sapphire ($Al_2O_3$) or other materials. On these layers, an adhesive layer made of glass or silicon is formed to provide a piezoelectric member.

Thereafter, the two piezoelectric members are joined via the adhesive layers by an anode junction method. Then, one of the substrates is removed by grinding or another method. After the removal of one of the substrates, another adhesive layer is formed on the exposed electrode layer again. This adhesive layer and the adhesive layer of another piezoelectric member are joined again. By repeating these steps, a multilayered laminate is formed. Thereafter, a laminated actuator is produced by alternately leading the inner electrodes in this laminate from both sides.

Such a thin film laminated actuator features an inexpensive power supply circuit because the drive voltage is low. However, because external electrodes are formed from the two side faces of a laminate of multilayered piezoelectric members via insulating layers, the external electrodes must be formed for each laminate. This poses a problem in mass production. Additionally, because this actuator is structured so that displacement occurs in the direction perpendicular to the surface of the substrate, the shape of the actuator is not suitable as a micro-actuator for the head slider of a disk drive, for example.

SUMMARY OF THE INVENTION

The present invention aims to improve the reproducibility of the shape of piezoelectric elements in etching, to prevent failures, e.g. short circuits between the electrodes sandwiching a piezoelectric thin film, and to provide a thin film piezoelectric element having excellent piezoelectric characteristics and few variations. The present invention also aims to provide a method of manufacturing the piezoelectric element, and an actuator using the piezoelectric element.

According to one aspect of the present invention, there is provided a thin film piezoelectric element. The thin film piezoelectric element includes a structure in which a first piezoelectric thin film, which is sandwiched (disposed) between a first main electrode layer and a first opposite electrode layer, and a second piezoelectric thin film, which is sandwiched between a second main electrode layer and a second opposite electrode layer, are coupled so that the first opposite electrode layer and the second opposite electrode layer are opposed to each other and are physically and electrically connected to each other. The thin film piezoelectric elements also includes an insulating layer covering the outer periphery along the thickness of the structure.

The first main electrode layer in an electrode leading area has a first main electrode layer projection that partially extends from the first piezoelectric thin film. A first connection wiring for connecting the first main electrode layer projection and the second main electrode layer is disposed via a first opening that is formed through the insulating layer on the first main electrode layer projection.

The second main electrode layer, the second piezoelectric thin film, and the second opposite electrode layer in the electrode leading area are formed narrower than the first opposite electrode layer so as to provide a region in which the insulating layer is provided on the first opposite electrode layer. A second connection wiring for establishing an electrical connection to the first opposite electrode layer is provided via a second opening that is formed through the insulating layer in this region.

According to another aspect of the present invention, there is provided a thin film piezoelectric element which includes a pair of element parts disposed in a plane with a predetermined space held therebetween, a piezoelectric function area working as a piezoelectric body of the pair of element parts having mirror images that are symmetrical with respect to the centerline of the predetermined space. The thin film piezoelectric element according to the another aspect of the present invention also includes a joint for coupling the element parts in a part of the predetermined space, where the joint is made of at least one kind of material comprising the element parts.

Each of the element parts includes a structure in which a first piezoelectric thin film, which is sandwiched (disposed) between a first main electrode layer and a first opposite electrode layer, and a second piezoelectric thin film, which is sandwiched between a second main electrode layer and a second opposite electrode layer, are coupled so that the first opposite electrode layer and the second opposite electrode layer are opposed to each other and are physically and electrically connected to each other. Each of the element parts also include an insulating layer covering the outer periphery along the thickness of the structure.

The first main electrode layer of an electrode leading area has a first main electrode layer projection that partially projects from the first piezoelectric thin film. The second main electrode layer, the second piezoelectric thin film, and the second opposite electrode layer in the electrode leading area are formed narrower than the first opposite electrode layer so as to provide a region in which the insulating layer is provided on the first opposite electrode layer. At least one of a first opening formed through the insulating layer on the first main electrode layer projection or a second opening formed through the insulating layer on the first opposite electrode layer in this region is provided. A connection wiring establishing a connection to the first opposite electrode layer or the first main electrode layer and leading to a surface layer is provided via the first opening or the second opening.

With this structure, only the insulating layer needs to be etched after the two piezoelectric thin films are joined. This facilitates etching and improves the accuracy of pattern shapes. Additionally, because openings do not need to be formed through the piezoelectric thin films, failures, such as short circuits between the electrodes sandwiching the piezoelectric thin films, can be prevented.

DETAILED DESCRIPTION OF THE INVENTION

Thin film piezoelectric elements of exemplary embodiments of the present invention are specifically described hereinafter with reference to the accompanying drawings. Throughout the drawings, same components are denoted with the same reference marks, and thus, the description of those components is omitted in some cases.

First Exemplary Embodiment

Descriptions are provided of thin film piezoelectric element 54, a method of manufacturing the thin film piezoelectric element 54, and an actuator and disk drive using the thin film piezoelectric element 54 of the first exemplary embodiment of the present invention.

Figure 1:
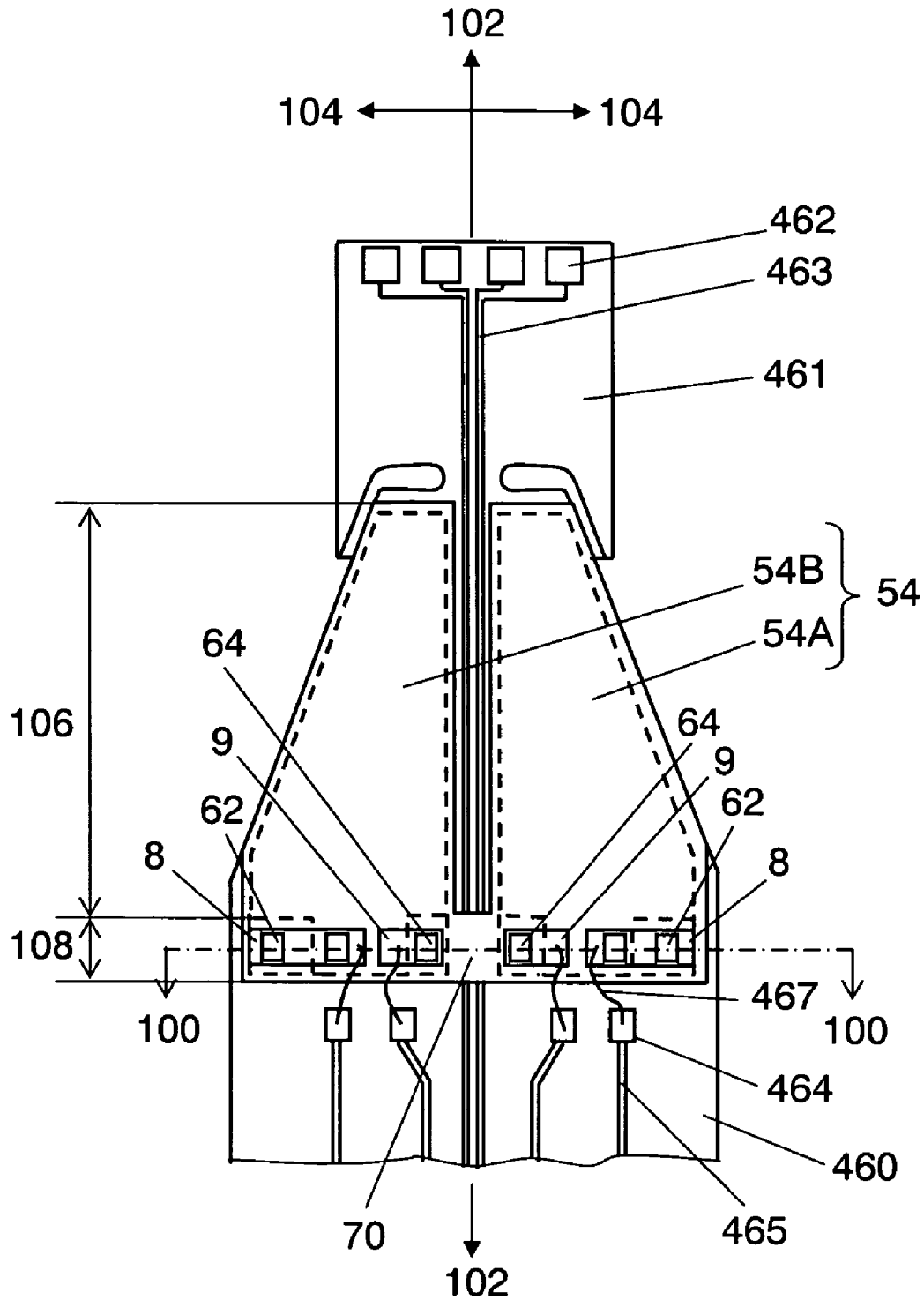
FIG. 1 is a plan view of an actuator using a thin film piezoelectric element made of a pair of element parts in accordance with a first exemplary embodiment of the present invention.

FIG. 1 shows a plan view of an actuator using the thin film piezoelectric element 54, which is made of a pair of element parts 54A and 54B, in accordance with the present invention. This actuator is used to precisely position the recording/reproducing head in specific positions on a disk in various kinds of disk drives.

The first exemplary embodiment describes a case where the actuator is used for a magnetic disk recording/reproducing device. In a magnetic disk recording/reproducing device, the actuator is used to jog the head slider having a magnetic head mounted thereon so as to perform high-precision micro-positioning of the magnetic head in specific track positions on a disk.

The thin film piezoelectric element 54 shown in FIG. 1 has two element parts 54A and 54B. The pair of element parts 54A and 54B has a relation of mirror images with respect to line 102—102. Further, each of the element parts 54A and 54B is structured of a piezoelectric function area 106 mainly working as a piezoelectric body, and an electrode leading area 108 mainly working for connection to external circuits.

The pair of element parts 54A and 54B is bonded and fixed to flexure 460, i.e. a supporting member, by an adhesive resin layer (not shown). After bonding, connection electrode pads made of first connection wirings 8 and second connection wirings 9 provided on each of the element parts 54A and 54B are connected to electrode pads for a piezoelectric element 464 provided on the flexure 460 by wire leads 467, for example, so as to form an actuator for micro-positioning the head.

The flexure 460 extends from an area having the thin film piezoelectric element 54 joined thereto, and has a slider supporting member 461 for fixing a head slider (not shown). Head electrode pads 462 for establishing a connection to the electrode terminals on the magnetic head (not shown) mounted on the head slider (not shown) are provided in the slider supporting member 461. From the head electrode pads 462, head electrode wirings 463 are routed on the flexure 460 between the thin film piezoelectric element parts 54 toward connection pads (not shown) to external equipment similar to the manner in which electrode wirings for the piezoelectric element 465 are routed from electrode pads for the piezoelectric element 464.

Figure 2:
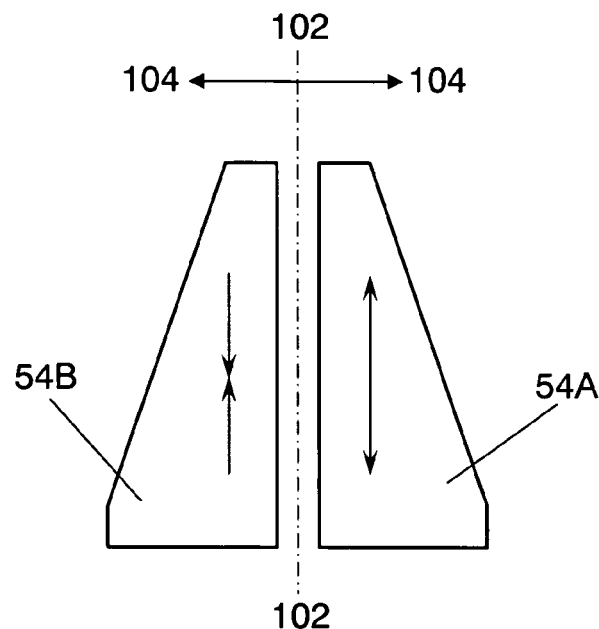
FIG. 2 is a drawing for describing an idea of the operation of the actuator.

The operation of an actuator structured as stated above is described. When voltages of opposite polarities are applied to the pair of element parts 54A and 54B of the thin film piezoelectric element 54, one element part 54A expands and the other element part 54B contracts as illustrated in FIG. 2. The displacement in these two opposite parallel directions effects on the slider supporting member 461. Responsive to the resultant force, the slider supporting member 461 jogs in the direction of line 104—104. By high-precision control of such jogging, the magnetic head can be highly precisely positioned in predetermined track positions on a disk (not shown). For instance, when the thickness of the piezoelectric thin film of each element part 54A or 54B is 2.5 μm and voltages of ±5V of opposite phases are applied, the amount of displacement of the head in the direction of 104—104 can be made to be ±0.8 μm.

Figure 3:
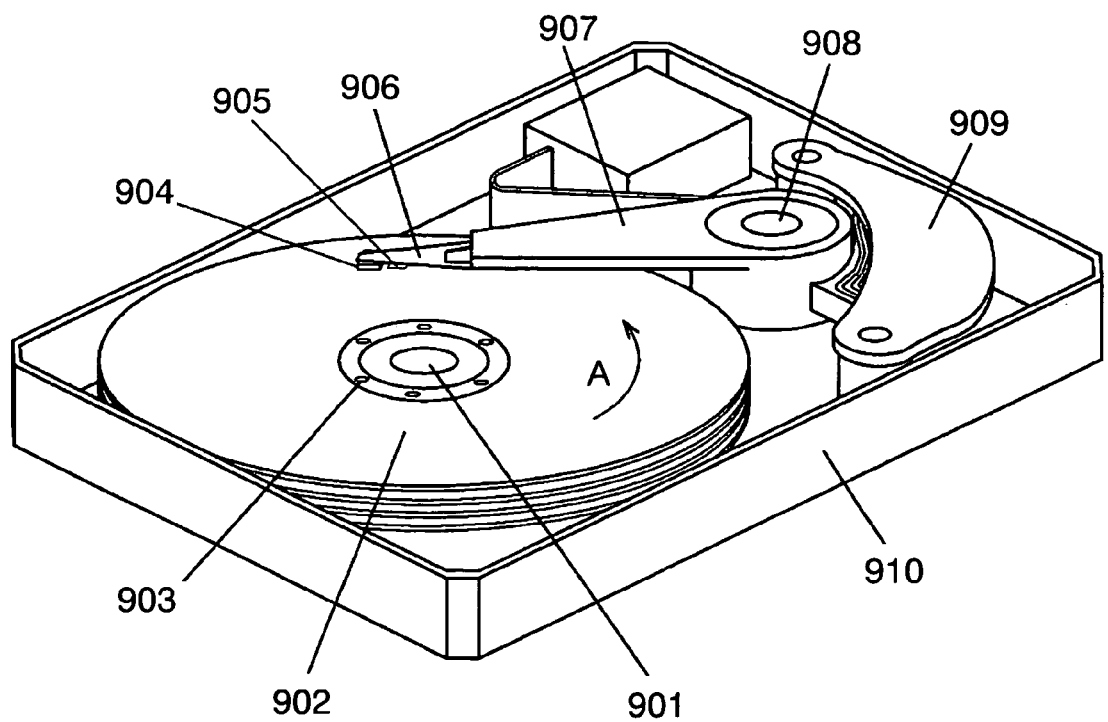
FIG. 3 is a perspective view of an essential part of a magnetic disk recording/reproducing device using the actuator of the first exemplary embodiment.

A perspective view of an essential part of a magnetic disk recording/reproducing device using this actuator is shown in FIG. 3. Magnetic disk 902 is fixed to main spindle 901, and is rotated by rotating means 903 in the direction shown by arrow A at specific revolutions. As the rotating means 903, a spindle motor is generally used. On a side opposed to the magnetic disk 902, a suspension arm 906 having a flexure (not shown) is fixed to an arm 907. The arm 907 is pivotally supported by a bearing 908. A head slider 904 is fixed to the flexure. Further, a pair of thin film piezoelectric element parts 54 is fixed to the flexure, i.e. a supporting member. This flexure and thin film piezoelectric element 54 constitute actuator 905.

A first positioning means 909, which is a VCM, rocks the arm 907 to a position head slider 904 in specific track positions on the magnetic disk 902. In a conventional magnetic disk recording/reproducing device, positioning is performed only by this first positioning means 909, i.e. the VCM. However, in the first exemplary embodiment, the above-mentioned actuator 905 further jogs the head slider 904 for more highly precise positioning. Because this jogging of the actuator 905 can be controlled by voltages that are applied to the thin film piezoelectric element 54, the actuator 905 sufficiently allows the magnetic head to follow minute track positions. This enables further high-density recording and reproduction. The entire parts of the magnetic disk recording/reproducing device are covered with a housing 910 and a lid (not shown) to be hermetically sealed from the outside air.

Figure 4:
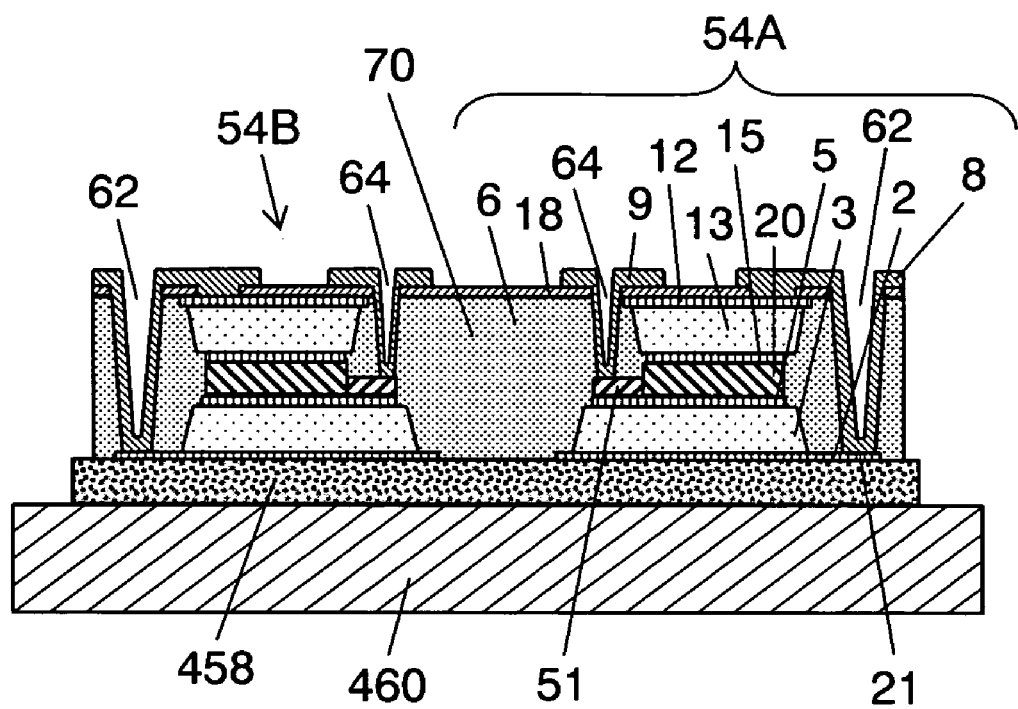
FIG. 4 is a drawing for illustrating a sectional structure of the actuator taken along line 100—100 of FIG. 1.

The sectional structure of this actuator is shown in FIG. 4. FIG. 4 shows a sectional shape of the actuator taken along line 100—100 of FIG. 1.

As is obvious from FIG. 1 and the description thereof, the thin film piezoelectric element 54 of the first exemplary embodiment has mirror images which are symmetrical with respect to line 102—102. The respective element parts 54A and 54B are structured so that a first piezoelectric thin film 3, which is sandwiched (disposed) between a first main electrode layer 2 and a first opposite electrode layer 5, and a second piezoelectric thin film 13, which is sandwiched (disposed) between a second main electrode layer 12 and a second opposite electrode layer 15, are coupled with the first opposite electrode layer 5 and the second opposite electrode layer 15, which are joined and fixed to each other via conductive adhesive layer 20. The outer periphery of the thin film piezoelectric element 54 is protected by an insulating layer 6 of the same thickness. An insulating protective coat 18 is formed on the insulating layer 6 and the second main electrode layer 12.

Further, in the piezoelectric function area 106 mainly working as a piezoelectric body, the first main electrode layer 2, the first opposite electrode layer 5, the first piezoelectric thin film 3, the second main electrode layer 12, the second opposite electrode layer 15 and second piezoelectric thin film 13 are all formed into the same shape.

The insulating layer 6 protects the first piezoelectric thin film 3, the second piezoelectric thin film 13 and other components, and prevents contact of the first connection wiring 8 with the first opposite electrode layer 5, the second opposite electrode layer 15 and adhesive layer 20 and from short circuits therebetween. In the first exemplary embodiment, because the insulating layer 6 is made of a resin material, the insulating layer 6 is hereinafter referred to as an insulating resin layer 6.

Also, in the electrode leading area 108, the overall shape of the thin film piezoelectric element 54 is structured so that the first piezoelectric thin film 3, which is sandwiched between the first main electrode layer 2 and the first opposite electrode layer 5, and the second piezoelectric thin film 13, which is sandwiched between the second main electrode layer 12 and the second opposite electrode layer 15 are coupled with first opposite electrode layer 5 and second opposite electrode layer 15 physically and are electrically connected to each other by the conductive adhesive layer 20.

However, on the outer peripheral sides opposite to the inner peripheral sides where element parts 54A and 54B are opposite to each other, the first main electrode layer 2 partially extends and forms first main electrode layer projections 21 which project from the first piezoelectric thin film 3. First openings 62 reaching the first main electrode layer projections 21 are formed through the insulating resin layer 6. Via each of the first openings 62, the first main electrode layer projection 21 is electrically connected to the second main electrode layer 12 by a first connection wiring 8.

On the other hand, in the inner peripheral sides where element parts 54A and 54B are opposite to each other, the second main electrode layer 12, the second piezoelectric thin film 13 and the second opposite electrode layer 15 are partially notched and are formed narrower than the first opposite electrode layer 5. This makes a region in which the first opposite electrode layers 5 are exposed (hereinafter referred to as "first opposite electrode layer projection 51"). Second openings 64 reaching the first opposite electrode layer projections 51 are formed through the insulating resin layer 6. Via each of the second openings 64, a second connection wiring 9, which is connected to the first opposite electrode layer 5, is formed to the surface of the insulating protective coat 18.

Because the first opposite electrode layer 5 and the second opposite electrode layer 15 are joined by the conductive adhesive layer 20, the second opposite electrode layer 15 is also connected to the second connection wiring 9. A joint 70 for coupling the two element parts 54A and 54B is formed by the insulating resin layer 6 so as to integrate two parts.

The first connection wirings 8 and the second connection wirings 9 also serve as connection electrode pads for establishing a connection to the electrode pad for piezoelectric elements 64, as shown in FIG. 1. Thus, the thin film piezoelectric element 54 is formed.

The thin film piezoelectric element 54 is bonded and fixed to the flexure 460 by an adhesive resin layer 458. Materials of the adhesive resin layer 458 include commercially available one-part cold-setting epoxy resin, two-part adhesive, and urethane resin.

In the thin film piezoelectric element 54, a protective coat for protecting the first connection wirings 8 and the second connection wirings 9 can be formed, and holes can be provided in specific areas so as to form connection electrode pads. This structure can protect the first connection wirings 8 and the second connection wirings 9 from the external environment, thereby further improving the reliability.

A method of manufacturing the thin film piezoelectric element 54 of the first exemplary embodiment is detailed hereinafter with reference to the drawings. FIGS. 5A through 8D are drawings for illustrating major steps in the method of manufacturing the thin film piezoelectric element 54 of the first exemplary embodiment. Because the thin film piezoelectric element 54 of the first exemplary embodiment is characterized by the structure of the connection wirings for establishing a connection to the electrode pads for the piezoelectric elements 64, the steps are described with reference to a sectional shape that is taken along line 100—100 of FIG. 1.

First, formation and processing of the thin films on a first substrate 1 is described with reference to FIGS. 5A through 5D.

Figure 5A:
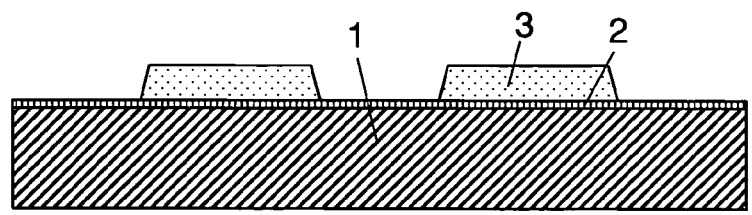
FIG. 5A is a sectional view showing that a first main electrode layer and a first piezoelectric thin film are laminated on a first substrate and then the first piezoelectric thin film is etched in a method of manufacturing a thin film piezoelectric element in accordance with the first exemplary embodiment of the present invention.

FIG. 5A shows that the first main electrode layer 2 and the first piezoelectric thin film 3 are laminated on the first substrate 1, and then, the first piezoelectric thin film 3 is etched into a predetermined shape.

Because excellent piezoelectric characteristics are required of the first piezoelectric thin film 3, it is important to carefully select the materials of the first substrate 1 and the piezoelectric thin film 3 and the conditions for forming them. For example, a magnesium oxide single-crystal substrate (MgO substrate) is used as the first substrate 1. On this MgO substrate, a c-axis oriented platinum layer (Pt layer) is sputtered as the first main electrode layer 2. Thereafter, a lead zirconium titanate (PZT) film, for example, is sputtered on this Pt layer so as to provide a thin film having excellent piezoelectric characteristics. Forming this PZT film while the temperature of the MgO substrate is kept at approximately 600° C. can provide a PZT film which is polarized in the direction that is perpendicular to the surface of the first piezoelectric thin film 3.

As the first substrate 1, a strontium titanate substrate, sapphire substrate, or silicon single-crystal substrate (Si substrate), for example, can be used instead of the MgO substrate. As materials of the first main electrode layer 2, one of gold (Au), iridium (Ir), rhodium (Rh), ruthenium (Ru), silver (Ag), rhenium (Re) and palladium (Pd) and its conductive oxides can be used instead of the Pt layer. Further, as the first piezoelectric thin film 3, lead lanthanum zirconate titanate (PLZT), barium titanate, and other material can be used instead of the PZT.

To etch the first piezoelectric thin film 3 into a predetermined shape, a dry etching or a wet etching process can be used. Wet etching can especially be performed for a short period of time with simple equipment, and thus, wet etching is advantageous to an improvement for mass production. In wet-etching a PZT film, a mixed liquid of hydrofluoric acid and nitric acid, a mixed liquid of hydrofluoric acid, nitric acid, and acetic acid, or a liquid containing either liquid further diluted by pure water can be used. At this time, only the first piezoelectric thin film 3 is etched, and thus, control of the etching is easy. Therefore, etching of the side portions and variations in shape that are caused by the etching can be reduced.

Figure 5B:
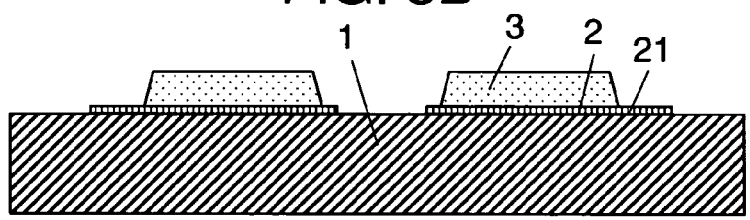
FIG. 5B is a sectional view showing that the first main electrode layer is etched in the manufacturing method.

FIG. 5B shows that the first main electrode layer 2 is also etched to a predetermined shape. After the first piezoelectric thin film 3 is etched, a photo-resist layer is applied to the surface of the first substrate 1, exposed to light and developed using a predetermined photomask, and the first main electrode layer 2 is etched by using the resist pattern as a mask. Because the first main electrode layer 2 is much thinner than the first piezoelectric thin film 3, patterns can accurately be formed by either of dry etching or wet etching. Depending on the material of the electrode layer, dry etching or wet etching can be selected.

At this time, the first main electrode layer 2 is patterned into the following shape. The overall shape is substantially the same as that of the first piezoelectric thin film 3; however, the first main electrode layer 2 is larger than the first piezoelectric thin film and the outer periphery of the first main electrode layer 2 is slightly exposed. In the electrode leading area 108, a part of the first main electrode layer 2 extends on the outer peripheral sides so as to form the first main electrode layer projections 21 that project from the first piezoelectric thin film 3. Such a pattern can easily be obtained by using a photomask.

When the overall shape of the first main electrode layer 2 is extended from the first piezoelectric thin film 3, the first piezoelectric thin film 3 is not exposed to a chemical solution for etching the first substrate 1 to remove the first substrate 1 from the thin film piezoelectric element 54. In general, the chemical solution for etching first substrate 1 for removal often etches the first piezoelectric thin film 3 to some extent. When the first main electrode layer 2 is formed wider than first piezoelectric thin film 3, the first piezoelectric thin film 3 is protected by the first main electrode layer 2 and is not brought into direct contact with the chemical solution. As a result, etching of the first piezoelectric thin film 3 by the chemical solution is prevented.

When the first substrate 1 is removed by grinding, or a chemical solution for etching does not etch the first piezoelectric thin film 3, the above-described structure is unnecessary.

Figure 5C:
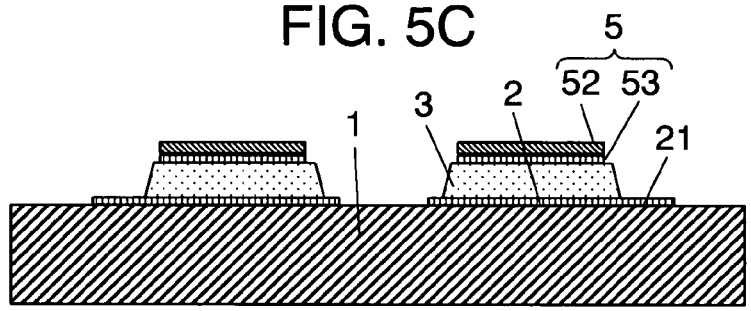
FIG. 5C is a sectional view showing that a first opposite electrode layer is formed on the first piezoelectric thin film in the manufacturing method.
Figure 5D:
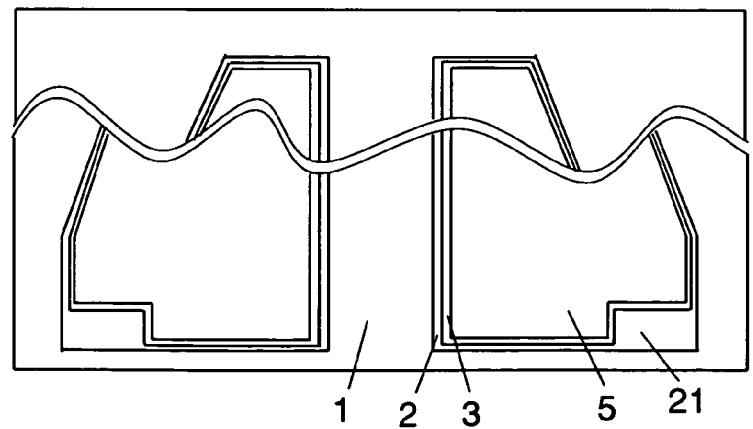
FIG. 5D is a plan view showing that the first opposite electrode layer is formed on the first piezoelectric thin film, in the manufacturing method.

FIG. 5C shows a sectional view showing that the first opposite electrode layer 5 is further formed on the first piezoelectric thin film 3. FIG. 5D is a plan view thereof. The shape of the first opposite electrode layer 5 is substantially the same as that of the first piezoelectric thin film 3. Additionally, the first opposite electrode layer 5 is formed only on the surface layer of the first piezoelectric thin film 3 so as to not be in electrical contact with first main electrode layer 2. In the first exemplary embodiment, the first opposite electrode layer 5 has a multi-layer structure. In other words, the upper layer 52 is made of gold (Au) and the lower layer 53 is a Pt layer similar to the first main electrode layer 2. For the lower layer 53, the same material can be selected as for the first main electrode layer 2 as is required. Even with the first opposite electrode layer 5 having such a multi-layer structure, a predetermined pattern can easily be formed by general techniques for the photolithography process and the etching process.

As is obvious from FIGS. 5C and 5D, in the piezoelectric function area 106, the first main electrode layer 2, the first piezoelectric thin film 3, and the first opposite electrode layer 5 are the same shape and are laminated similar steps from the side of first substrate 1. On the other hand, in electrode leading area 108, as shown in the drawings, the first electrode layer projections 21, where the first main electrode layers 2 are partially exposed are formed. In these steps, the formation and processing of films on the first substrate 1 are completed.

Next, the formation and processing of thin films on a second substrate 11 are described with reference to FIGS. 6A through 6D.

Figure 6A:
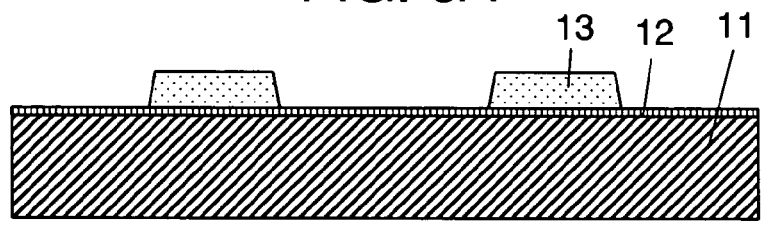
FIG. 6A is a sectional view showing that a second main electrode layer and a second piezoelectric thin film are laminated on a second substrate and then the second piezoelectric thin film is etched, in the manufacturing method.

FIG. 6A shows that the second main electrode layer 12 and second piezoelectric thin film 13 are laminated on the second substrate 11, and then, the second piezoelectric thin film 13 is etched into a predetermined pattern shape.

Figure 6B:
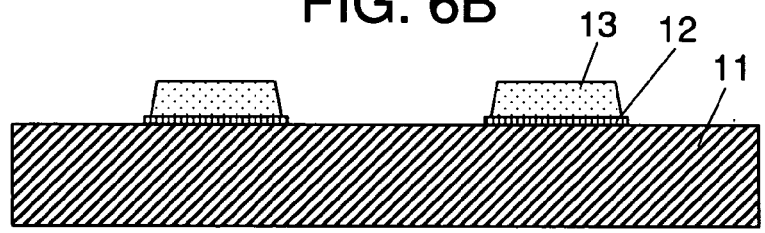
FIG. 6B is a sectional view showing that the second main electrode layer is etched in the manufacturing method.

FIG. 6B shows that the second main electrode layer 12 under the second piezoelectric thin film 13 is etched into a similar predetermined pattern shape. The second main electrode layer 12 is substantially the same in overall shape as the second piezoelectric thin film 13, but is slightly exposed from the second piezoelectric thin film 13. This is the same as the pattern structure of the first piezoelectric thin film 3 and the first main electrode layer 2 on the first substrate 1.

Figure 6C:
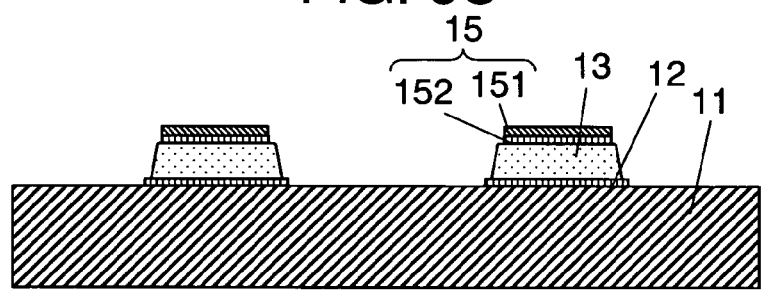
FIG. 6C is a sectional view showing that a second opposite electrode layer is formed on the second piezoelectric thin film in the manufacturing method.

FIG. 6C shows that the second opposite electrode layer 15 is formed on the second piezoelectric thin film 13. The second opposite electrode layer 15 is substantially the same in overall shape as the second piezoelectric thin film 13, but is formed only on the surface of the second piezoelectric thin film 13 so as to not be in electrical contact with the second main electrode layer 12. The second opposite electrode layer 15 also has a multi-layer structure. An upper layer 151 of the second opposite layer 15 is made of tin (Sn) and a lower layer 152 of the second opposite electrode layer 15 is a Pt layer.

The same material as used for the first substrate 1 can be used for the second substrate 11. Further, for the second main electrode layer 12 and the second piezoelectric thin film 13 that are formed on the second substrate 11, the materials of the films on the first substrate 1 and the methods forming them can be used.

Figure 6D:
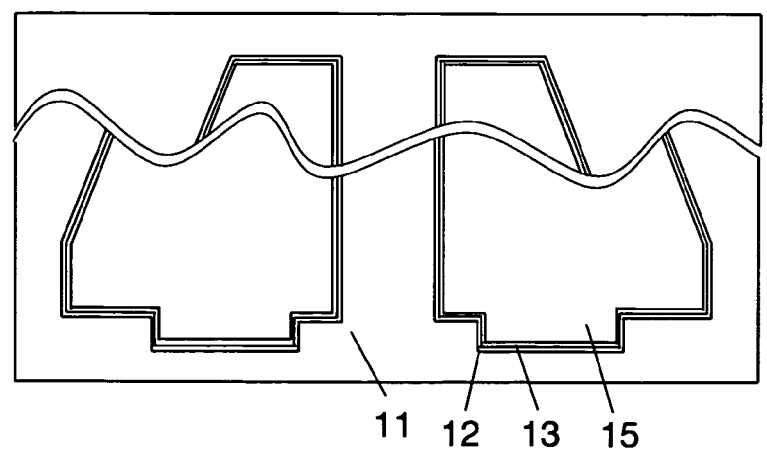
FIG. 6D is a plan view showing that the second opposite electrode layer is formed on the second piezoelectric thin film in the manufacturing method.

FIG. 6D is a plan view showing the processed state as shown in FIG. 6C. The second main electrode layer 12, the second piezoelectric thin film 13, and the second opposite electrode layer 15 have the same pattern shape as a whole, but are laminated similar to the steps from the side of the second substrate 11. When seen from the front side, the piezoelectric element has second piezoelectric thin film 13 and the second main electrode layer 12 each exposed in the outer periphery thereof. This structure prevents an electrical contact between the second main electrode layer 12 and the second opposite electrode layer 15. Further, this structure also prevents the second piezoelectric thin film 13 from being exposed to the chemical solution for etching the second substrate 12 for removal.

On the outer peripheral sides of the electrode leading area 108, the pattern shape of the second main electrode layer 12, the second piezoelectric thin film 13, and the second opposite electrode layer 15 are the same as that of the first opposite electrode layer 5 and the first piezoelectric thin film

3. However, on the inner peripheral sides, the second main electrode layer 12, second piezoelectric thin film 13, and the second opposite electrode layer 15 are partially notched at the corners. Therefore, in these areas, the second opposite electrode layers 15 are formed narrower than the first opposite electrode layer 5. When the first substrate 1 and the second substrate 11 are joined, the first opposite electrode layer 5 in these notched areas is exposed so as to form the first opposite electrode layer projections 51.

Next, a description is provided of a step in which the first substrate 1 subjected to the steps shown in FIG. 5C and the second substrate 11 subjected to the steps shown in FIG. 6C are joined so as to provide the thin film piezoelectric element 54.

Figure 7A:
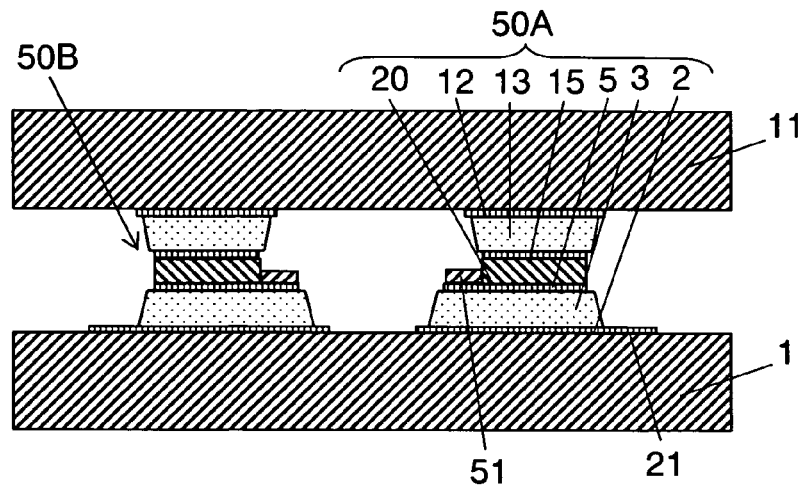
FIG. 7A is a sectional view showing that the first opposite electrode layer and the second opposite electrode layer are joined to each other in the manufacturing method.

FIG. 7A is a sectional view showing that the first opposite electrode layer 5 and the second opposite electrode layer 15 are brought into opposite intimate contact with and joined to each other. The first electrode layer 5 and the second opposite electrode layer 15 are joined as follows. On the surface of the first opposite electrode layer 5, an Au layer is formed as the upper layer 52. On the second opposite electrode layer 15, a Sn layer is formed as the upper layer 151. When both upper layers 52, 151 are brought into intimate contact with each other and are heated to temperatures at which Au—Sn eutectic reaction occurs, the two upper layers melt and join so as to form the integrated adhesive layer 20.

Thus, a laminated structure via the adhesive layer 20 can be obtained. Structures 50A and 50B forming element parts 54A and 54B, respectively, are produced so that a certain space is held therebetween. On the first substrate 1 and the second substrate 11, a plurality of such pairs of the structures 50A and 50B are produced. However, for simplicity, only one pair is illustrated in the drawing.

In the first exemplary embodiment, two components are joined by the Au—Sn eutectic reaction; however, the present invention is not limited to this method. Any combination of materials to be joined at relatively low temperatures can be used. For example, combinations arbitrarily selected from a first group consisting of Au, Ag and Cu, and a second group consisting of Sn, Cd, Au-containing Sn and Au-containing Cd can be used. Alternatively, soldering material can be formed on each upper layer for soldering. Further, a conductive adhesive can also be used for joining.

When an MgO substrate is used as the first substrate 1 and the second substrate 11, a piezoelectric thin film formed on this MgO substrate is polarized in the direction perpendicular to the substrate surface. For this reason, such joining makes the direction of polarization opposite to each other. Therefore, when the same electric potential is applied to the first main electrode layer 2 and the second main electrode layer 12, and the same electric potential is applied to the first opposite electrode layer 5 and the second opposite electrode layer 15, the first piezoelectric thin film 3 and the second piezoelectric thin film 13 can perform the same expansion and contraction movements.

Figure 7B:
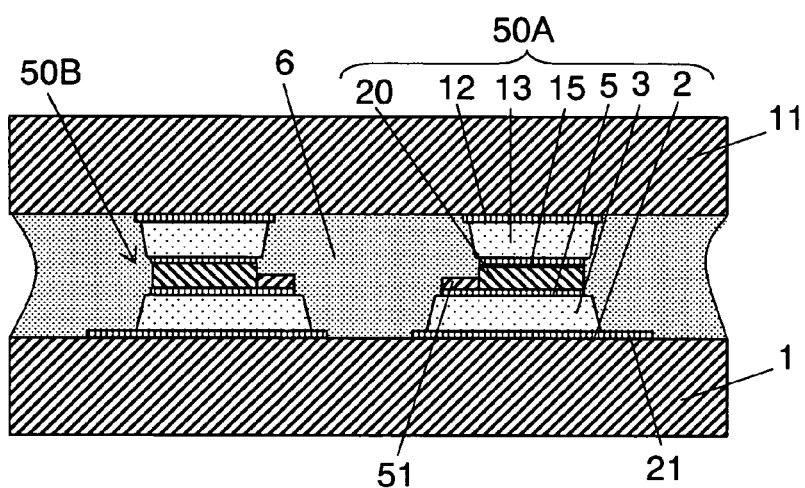
FIG. 7B is a sectional view showing that a gap is filled with an insulating resin layer in the manufacturing method.

A pair of structures 50A and 50B is formed by the joining. A gap corresponding to the thickness of these structures 50A and 50B is generated between the first substrate 1 and the second substrate 11. By filling this gap with resin, the insulating resin layer 6 is formed. FIG. 7B shows a gap that is filled with the insulating resin layer 6. The thickness of these structures 50A and 50B is approximately 10 μm. By adjusting the viscosity of the resin, the resin can be penetrated and filled into the gap. The resin that can be formed by the photolithography process and etching is used.

In the first exemplary embodiment, a description is provided of a manufacturing method using an acrylic photosensitive resin. With acrylic photosensitive resin filled into the gap, the structures 50A and 50B together with the substrates are placed on a hot plate, for example, heated at a temperature of 60° C. for 10 minutes, and are successively heated at a temperature of 80° C. for 5 minutes. Such a heat treatment pre-bakes the acrylic photosensitive resin, i.e. the insulating resin layer 6. Pre-baking the insulating resin layer can protect the structures 50A and 50B from the chemical solution for etching the second substrate 11 for removal. Additionally, the insulating resin layer 6 can be etched into a predetermined pattern shape easily.

After the resin that is filled into the gap between the structures 50A and 50B are made by pre-baking the insulating resin layer 6, the second substrate 11 is removed by etching. Because the outer periphery of the structures 50A and 50B is completely protected by the insulating resin layer 6, structures 50A and 50B are not directly exposed to the etching solution except for the second main electrode layer 12. For this reason, there is no phenomenon of deterioration of the first piezoelectric thin film 3 and the second piezoelectric thin film 13 that is caused by exposure to the etching solution. At this time, it is necessary to selectively remove only the second substrate 11. The methods of this selective removal include etching, grinding, and etching after grinding to a predetermined thickness. When the first substrate 1 and the second substrate 11 are made of the same material, the surface of the first substrate 1 is covered with a resin that is not etched by the chemical solution, and then, etching is performed. In the first exemplary embodiment, a Pt layer is used as the second main electrode layer 12. Thus, the second main electrode layer 12 is not etched by the etching solution for the second substrate 11 of MgO, i.e. a mixture of phosphoric acid and acetic acid.

Figure 7C:
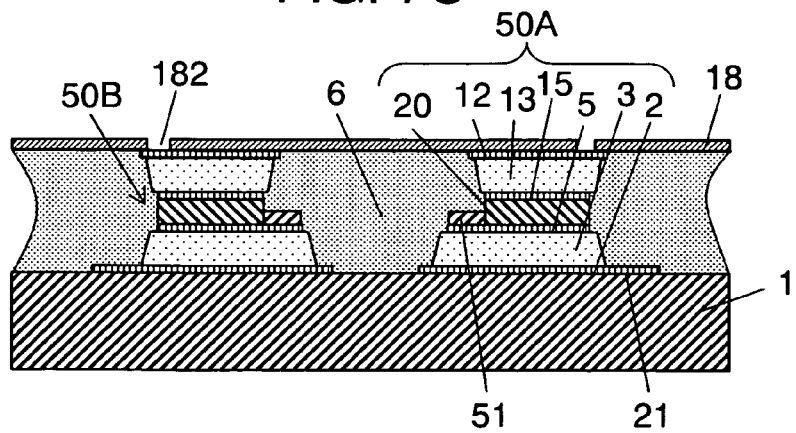
FIG. 7C is a sectional view showing that the second substrate is removed by etching, an insulating protective coat is formed, and predetermined holes are provided in the manufacturing method.

When the second substrate 11 is removed, the structures 50A and 50B and the insulating resin layer 6 coupling the structures are exposed. In this state, the insulating protective coat 18 for covering the surface of the insulating resin layer 6 and the second main electrode layer 12 is formed. Further, to partially expose the second main electrode layer 12, holes 182 are provided through the insulating protective coat 18. This state is shown in FIG. 7C. The holes 182 can be formed when the first openings 62 and the second openings 64 are formed through the insulating resin layer 6.

Figure 8A:
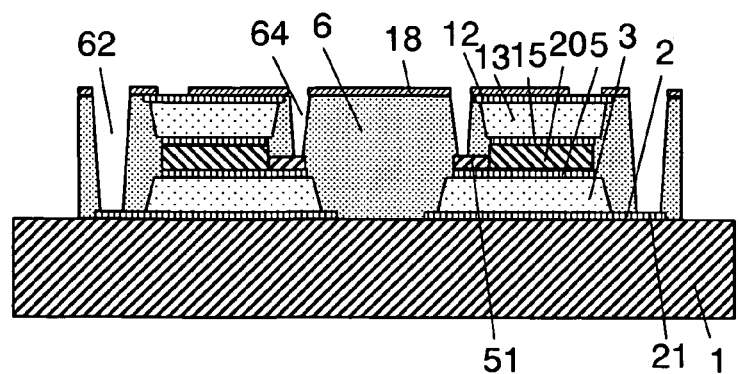
FIG. 8A is a sectional view showing that the insulating resin layer is etched to a shape covering a structure in the manufacturing method.

Next, as shown in FIG. 8A, the insulating resin layer 6 is etched into a shape such that the insulating resin layer 6 covers the outer periphery of the structures 50A and 50B. Because piezoelectric thin films and other components are not exposed in this etching process, they are not etched. Thus, the etching process is stable and reproducibility is excellent. If the insulating protective coat 18 that is formed on the surface is etched at the same time, etching is more efficient. Therefore, it is desirable that the insulating protective coat 18 and insulating resin layer 6 are made of the same material. During this etching process, a joint 70 for coupling the two element parts 54A and 54B is formed at the same time.

Further, the first openings 62 reaching the first main electrode layer projections 21 and the second openings 64 reaching the first opposite electrode layer projections 51 are formed. In this etching process, after a photo-resist layer is formed on the surface of the insulating protective coat 18, exposed to light and developed, the insulating protective coat 18 and the insulating resin layer 6 are etched at the same time. When the insulating protective coat 18 and the insulating resin layer 20 are made of the same photosensitive material, this process is easier. For example, when an acrylic photosensitive resin is used as the insulating resin layer 6 and a similar acrylic photosensitive layer is used as the insulating protective coat 18, the insulating protective coat 18 and the insulating resin layer 6 can be formed into a predetermined pattern shape at the same time only by exposure to light and development. The pattern shape after such a process is shown in FIG. 8A.

After such a process, the pre-baked insulating resin layer 6 is further heated at high temperatures for final baking. When acrylic photosensitive resin is used as the insulating resin layer 6, baking is completed by heating at a temperature of 150° C. for 30 minutes and by successively heating at a temperature of 200° C. for 30 minutes.

Heating for pre-baking and heating for final baking in two stages facilitates etching of the insulating resin layer 6 and removes solvent components remaining in the insulating resin layer 6 without fail. Thus, bubbles that are generated by the solvent components can surely be eliminated.

Protecting the outer periphery of the structures 50A and 50B by the insulating resin layer 6 can only improve humidity resistance and prevent deterioration of piezoelectric characteristics.

Described in the first exemplary embodiment is a case where acrylic photosensitive resin is used as the insulating resin layer 6 and the insulating protective coat 18. However, the present invention is not limited to this case. Such resins can include photosensitive epoxy resin, unsaturated polyester resin, thiol photosensitive resin, photolytic azide compound resin, naphtoquinone diazide (NQD) photosensitive resin, photo-crosslinkable dichromic acid resin, and polyvinyl photosensitive resin. The material is not limited to photosensitive resin. Any material on which a photo-resist layer can be formed and that is etched by using the photo-resist layer as a mask can be used without restrictions.

Alternatively, after the insulating resin layer 6 is formed into a predetermined pattern, the insulating protective coat 18 can be applied and etched. In this case, the insulating protective coat 18 can be a photosensitive material or a non-photosensitive material.

In the step shown in FIG. 8A, only the insulating resin layer 6 and the insulating protective coat 18 need to be etched when a predetermined pattern shape is formed or when openings are formed. Thus, accuracy of etching and yields are considerably improved. In other words, the step of forming the first openings 62 reaching the first main electrode layer projections 21 and the second openings 64 reaching the first opposite electrode layer projections 51 and the step of etching the outer periphery into a predetermined shape can be performed by etching only the insulating resin layer 6 and the insulating protective coat 18 formed thereon. For this reason, in comparison with a conventional method in which the first main electrode layer, first piezoelectric thin film, first opposite electrode layer, adhesive layer, second main electrode layer, second piezoelectric thin film and second opposite electrode layer are laminated and then a predetermined pattern is etched, short circuits and abnormal pattern shapes that are caused by any remaining materials in etching can almost securely be prevented.

Figure 8B:
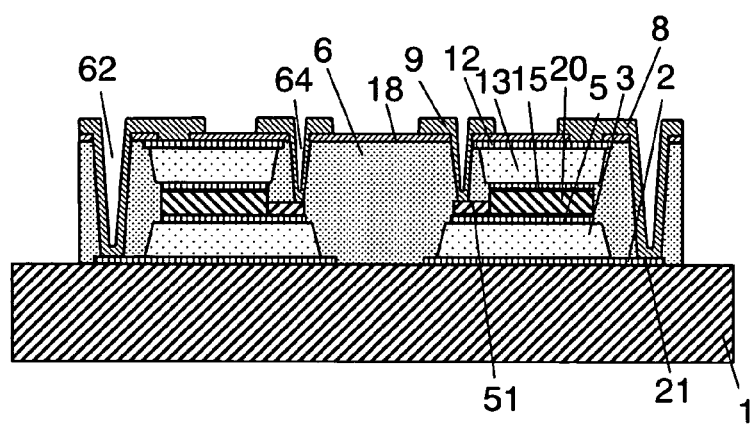
FIG. 8B is a sectional view showing that first connection wirings and second connection wirings are formed in the manufacturing method.

Next, to electrically connect the second main electrodes 12 and the first main electrode layer projections 21, the first connection wirings 8 are formed via the first openings 62. At the same time, the second connection wirings 9 are formed to lead the first opposite electrode layer projections 51 to the surface of the insulating protective coat 18 via the second openings 64. The first connection wirings 8 and the second connection wirings 9 are formed at the same time, and a predetermined pattern is formed by a photolithography process and etching process at the same time. FIG. 8B shows that the first connection wirings 8 and the second connection wirings 9 are formed in this manner.

In these processes, a shape of the thin film piezoelectric element 54 is completed although the thin film piezoelectric element 54 is still joined onto the first substrate 1. Thereafter, thin film piezoelectric element 54 is removed from first substrate 1 by etching. For this purpose, after resin, e.g. wax, is applied to the surface of the thin film piezoelectric element 54, the first substrate 1 is removed by etching. At this time, resin, e.g. wax, which is not etched by the chemical solution for etching the first substrate 1 is used.

Figure 8C:
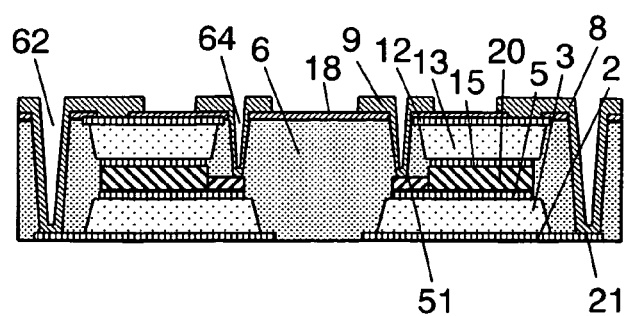
FIG. 8C is a sectional view showing that the thin film piezoelectric element is removed from the substrate in the manufacturing method.

After the first substrate 1 is removed by etching and then resin, e.g. wax, is removed by melting, the thin film piezoelectric element 54 which is completely separated from each substrate can be obtained. Such element is shown in FIG. 8C.

In the method of manufacturing a thin film piezoelectric element according to the first exemplary embodiment, the first piezoelectric thin film 3 and the second piezoelectric thin film 13 are etched on the first substrate 1 and the second substrate 11, respectively. Thus, etching after lamination is performed only on the resin layer made of the insulating resin layer 6 and the insulating protective coat 18. In the conventional method of etching piezoelectric thin films in a laminated state, material remaining on side walls of the piezoelectric thin films may cause short circuits between upper and lower electrode layers or a reduction in the width of the pattern. However, in the manufacturing method of the first exemplary embodiment, the respective components are etched separately, and only the resin layer is etched after lamination. Thus, such failures can securely be prevented and yields can be improved considerably.

The thin film piezoelectric element 54 is bonded to the flexure 460, i.e. a supporting member, by an adhesive resin layer. Connection electrode pads provided on the first connection wirings 8 and the second connection wirings 9 are connected to the electrode pads for the piezoelectric element 464 provided on the flexure 460 via the wire leads 467. Thus, the actuator 905 is completed.

Joining the first substrate 1 and the second substrate 11 is not limited to the above-mentioned eutectic reaction. A conductive adhesive can be applied to the opposed surfaces of the first opposite electrode layer 5 and the second opposite electrode layer 15 so as to join them together. At this time, the conductive adhesive can be applied to both opposite electrode layers or to one of the opposite electrode layers. When the conductive adhesive is applied to the first opposite electrode layer projection 51 and the second opening 64 is formed by etching the insulating resin layer 6, either adhesive layer 20 made of the conductive adhesive or the first opposite electrode layer 5 can be exposed. The conductive adhesive is not necessarily required in the piezoelectric function area 106. In other words, the conductive adhesive is used in the electrode leading area 108, and an insulating material can be used for bonding in the piezoelectric function area 106.

When the adhesive layer is formed by eutectic reaction, the opposite electrode layers melt once. Thus, self-alignment is possible. For this reason, even if the first opposite electrode layer 5 is aligned with the second opposite electrode layer 15 with low accuracy, the self-alignment effect at melting can align both layers with high accuracy for bonding.

Additionally, in the first exemplary embodiment, the filled insulating resin layer 6 is heat-treated under the conditions for pre-baking before removal of the second substrate 11. After the removal of the second substrate 11, the insulating resin layer 6 is etched into a predetermined pattern shape and then final baking is performed. Therefore, the insulating resin layer 6 is accurately patterned, and bubbles likely to occur in the insulating resin layer 6 can securely be inhibited.

Second Exemplary Embodiment

Figure 9:
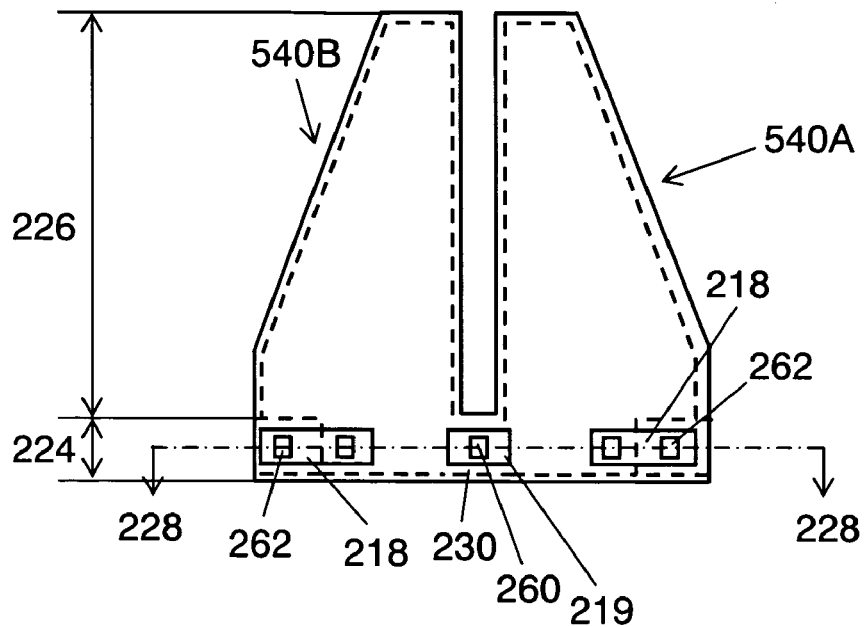
FIG. 9 is a plan view of a thin film piezoelectric element in accordance with a second exemplary embodiment of the present invention.
Figure 10:
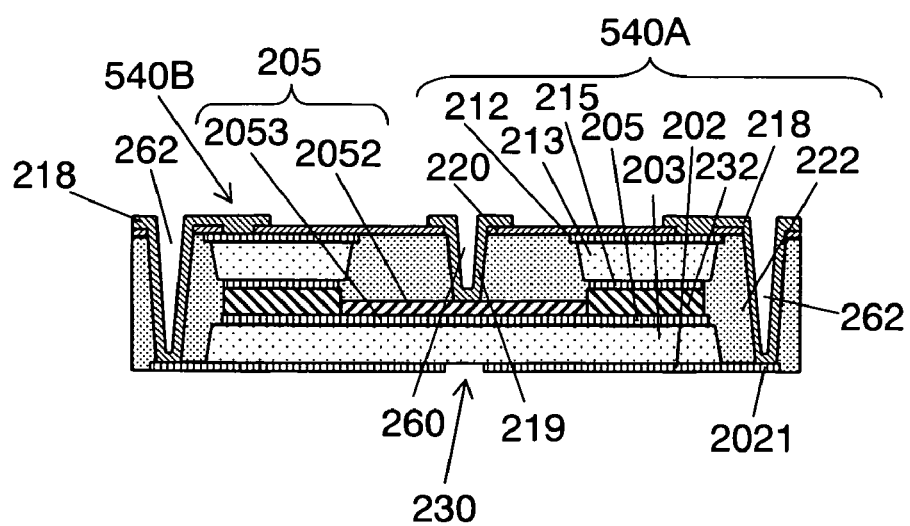
FIG. 10 is a sectional view of the thin film piezoelectric element in accordance with the second exemplary embodiment.

FIG. 9 is a plan view of a thin film piezoelectric element 540 in accordance with a second exemplary embodiment of the present invention. FIG. 10 is a sectional view thereof taken along line 228—228 of FIG. 9. The thin film piezoelectric element 540 of the second exemplary embodiment also has a pair structure. The structure of piezoelectric function area 226 of the respective element parts 540A and 540B is the same as that of the thin film piezoelectric element 54 of the first exemplary embodiment.

The piezoelectric function area 226 of the respective element parts 540A and 540B are structured so that a first piezoelectric thin film 203, which is sandwiched (disposed) between a first main electrode layer 202 and a first opposite electrode layer 205, and a second piezoelectric thin film 213 sandwiched (disposed) between a second main electrode layer 212 and a second opposite electrode layer 215, are coupled with the first opposite electrode layer 205 and the second opposite electrode layer 215 physically and are electrically connected to each other via a conductive adhesive layer 232. The outer periphery of the thin film piezoelectric element 540 is protected by an insulating layer 222 of the same thickness. An insulating protective coat 220 is formed on the insulating layer 222 and the second main electrode layer 212.

In the thin film piezoelectric element 540 of the second exemplary embodiment, the structure of an electrode leading area 224 is different from that of the thin film piezoelectric element 54 of the first exemplary embodiment. The difference is mainly described hereinafter. Also in the second exemplary embodiment, because the insulating layer 222 is made of a resin material, the insulating layer 222 is hereinafter referred to as an insulating resin layer 222.

On each of the outer peripheral sides of the electrode leading area 224, first main electrode layer projections 2021 and second main electrode layers 212 are connected by first connection wirings 218 via first openings 262 through the insulating resin layer 222. On the other hand, on the inner peripheral sides, the element parts 540A and 540B are coupled by first piezoelectric thin films 203 and first opposite electrode layers 205 thereof so as to form a joint 230. The two element parts 540A and 540B are coupled by the joint 230 so as to form an integrated structure. The first opposite electrode layers 205 of the respective element parts 540A and 540B are coupled to each other. As a result, the first opposite electrode layers 205 and the second opposite electrode layers 215 of respective element parts are all electrically connected. The insulating resin layer 222 in the joint 230 also has a second opening 260 that is formed therethrough. The first opposite electrode layer 205 is connected and lead to the surface by a second connection wiring 219 via the second opening 260.

As described above, for the thin film piezoelectric element 540 of the second exemplary embodiment, the number of the connection electrode pads to establish a connection to the electrode pads for piezoelectric element on the flexure is three. The three connection electrode pads are provided on the first connection wirings 218 and the second connection wiring 219.

Also in the second exemplary embodiment, an Au layer is formed as an upper layer 2052 on the surface of the first opposite electrode layer 205. A Sn layer is formed as an upper layer 2151 on the second opposite electrode layer 215. The upper layers 2052 and 2151 are brought into intimate contact with each other, and are heated to temperatures at which Au—Sn eutectic reaction occurs so as to melt and form an adhesive layer 232.

Hereinafter, a description is mainly provided of the steps which are different from those of the first embodiment with respect to a method of manufacturing the thin film piezoelectric element 540 of the second exemplary embodiment. FIGS. 11A through 13C are drawings for illustrating the major steps in a method of manufacturing the thin film piezoelectric element 540 the second embodiment. Also in thin film piezoelectric element 540 of the second exemplary embodiment, the steps are described with reference to a sectional shape taken along line 228—228 of FIG. 9.

Figure 11A:
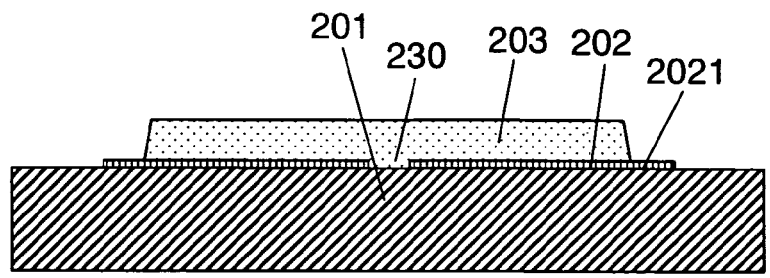
FIG. 11A is a sectional view showing that a first main electrode layer and a first piezoelectric thin film of predetermined patterns are laminated on a first substrate in a method of manufacturing a thin film piezoelectric element in accordance with the second exemplary embodiment.
Figure 11B:
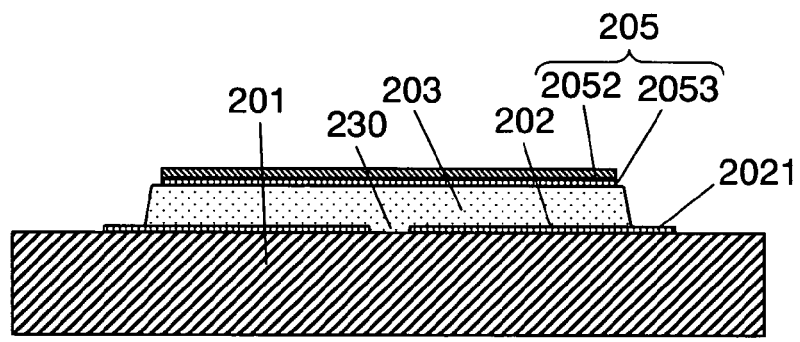
FIG. 11B is a sectional view showing that a first opposite electrode layer is further formed on the first piezoelectric thin film in the manufacturing method.
Figure 11C:
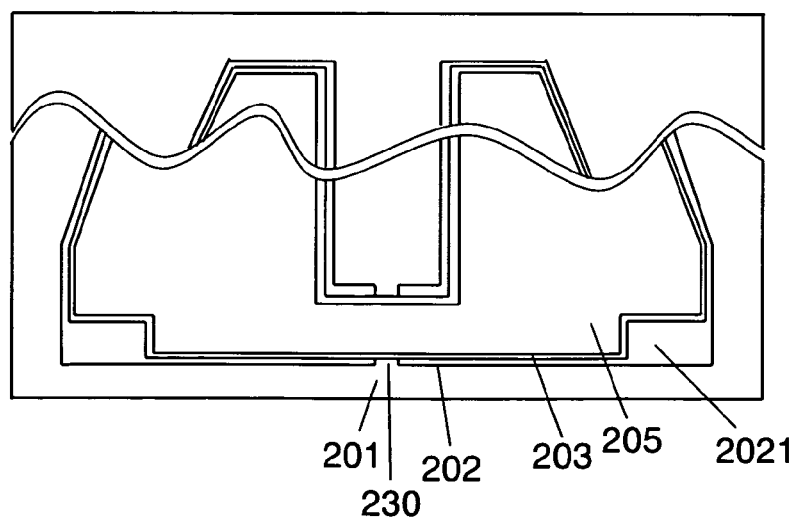
FIG. 11C is a plan view showing that the first opposite electrode layer is further formed on the first piezoelectric thin film in the manufacturing method.

First, a formation and processing of the thin films on a first substrate 201 is described by using FIGS. 11A through 11C.

FIG. 11A shows that the first main electrode layer 202 and then the first piezoelectric thin film 203 are formed into predetermined patterns on the first substrate 201. For example, first, when an electrode layer to be the first main electrode layer 202 is formed, the electrode layer is patterned by using a metal mask at the same time. Alternatively, after an electrode layer to be the first main electrode layer 202 is formed, a pattern is formed by a photolithography process and an etching process. Also in the second exemplary embodiment, first main electrode layer projections 2021 are formed.

Then, after a piezoelectric thin film to be the first piezoelectric thin film 203 is laminated, this piezoelectric thin film is etched into a predetermined shape. In the electrode leading area 224, the pattern shape of the first piezoelectric thin film 203 is partly different from that of the thin film piezoelectric element 54 of the first exemplary embodiment. In other words, in the electrode leading area 224, the joint 230 for coupling the first piezoelectric thin films 203 of both sides is formed.

Because the materials of the first substrate 201, the first main electrode 202, and the first piezoelectric thin film 203 and conditions for forming and etching them are the same as those of the first exemplary embodiment, the descriptions thereof are omitted.

FIG. 11B is a sectional view showing that the first opposite electrode layer 205 is further formed on the first piezoelectric thin film 203. FIG. 11C is a plan view thereof. The first opposite electrode layer 205 has substantially the same shape as the first piezoelectric thin film 203. Additionally, the first opposite electrode layer 205 is formed only on the surface of the first piezoelectric thin film 203 so as to not be in electrical contact with the first main electrode layer 202. In the second exemplary embodiment, the first opposite electrode layer 205 is also formed on the first piezoelectric thin film 203 in the joint 230.

Further, also in the second exemplary embodiment, the first opposite electrode layer 205 has a multi-layer structure. The upper layer 2052 is made of gold (Au), and a Pt layer is used as the lower layer 2053 similar to the first main electrode layer 202. For the lower layer 2053, the same material can be selected as for the first main electrode layer 202 as is required. Even with the first opposite electrode layer 205 having such a multi-layer structure, a predetermined pattern can easily be formed by general techniques for the photolithography process and the etching process.

As is obvious from FIGS. 11B and 11C, in the piezoelectric function area 226, the first main electrode layer 202, the first piezoelectric thin film 203, and the first opposite electrode layer 205 have the same shape and are laminated similar to the steps from the side of the first substrate 201. On the other hand, in the electrode leading area 224, as shown in the drawing, the first electrode layer projections 2021 where the first main electrode layer 202 is partially exposed are provided. In the joint 230, the first main electrode layer 202 is etched out so as to electrically separate the right and left sides. In these steps, the formation and processing of the films on the first substrate 201 is completed.

Next, the formation and processing of the thin films on a second substrate 211 is described with reference to FIGS. 12A and 12B.

Figure 12A:
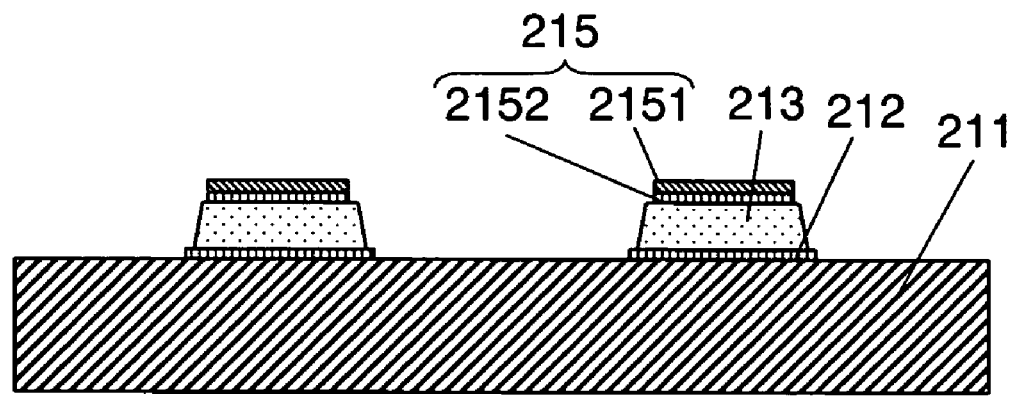
FIG. 12A is a sectional view showing that a second main electrode layer and a second piezoelectric thin film of predetermined patterns are laminated on a second substrate in the manufacturing method.
Figure 12B:
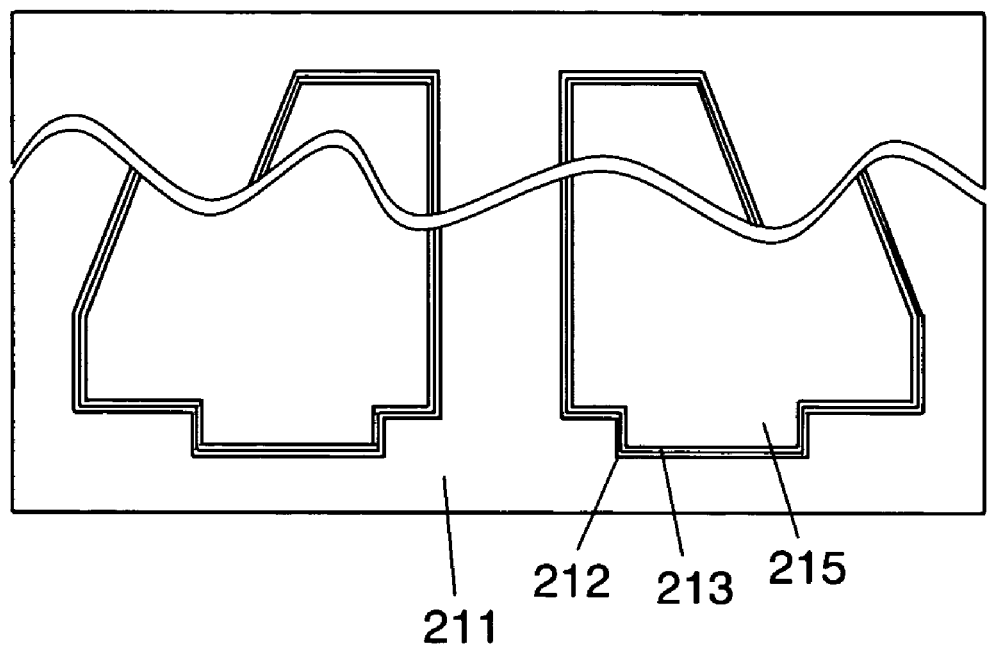
FIG. 12B is a plan view showing that the second main electrode layer and the second piezoelectric thin film of the predetermined patterns are laminated on the second substrate in the manufacturing method.

FIG. 12A is a sectional view showing that the second main electrode layer 212, the second piezoelectric thin film 213 and the second opposite electrode layer 215 are formed on the second substrate 211. FIG. 12B is a plan view thereof.

These pattern shapes on the second substrate 211 are the same as those on the first substrate 201 except for the electrode leading area 224. On each of the outer peripheral sides of the electrode leading area 224, the pattern shape of the second main electrode layer 212, the second piezoelectric thin film 213, and the second opposite electrode layer 215 are the same as that of the first opposite electrode layer 205 and the first piezoelectric thin film 203. However, on the inner peripheral sides, the second main electrode layer 212, the second piezoelectric thin film 213, and the second opposite electrode layer 215 are partially notched at the corners. Therefore, in these areas, the second electrode layers 215 are formed narrower than the first opposite electrode layer 205. When the first substrate 201 and the second substrate 211 are joined, the first opposite electrode layer 205 in these notched areas is exposed to so as to form first opposite electrode layer projections 2051. This shape is the same as that of the first exemplary embodiment. As shown in the drawing, no joint is provided on the second exemplary substrate 211. Also, the second opposite electrode layer 215 has a multi-layer structure. The upper layer 2151 is made of stannum (St) and a Pt layer is used as the lower layer 2152.

For the second substrate 211, the same material can be used as the first substrate 201. Further, for the second main electrode layer 212 and the second piezoelectric thin film 213 that is formed on the second substrate 211, the same materials of the films on the first substrate 201 and the method of forming them can be used. These descriptions are omitted because they are the same as those described for the first exemplary embodiment.

Figure 13A:
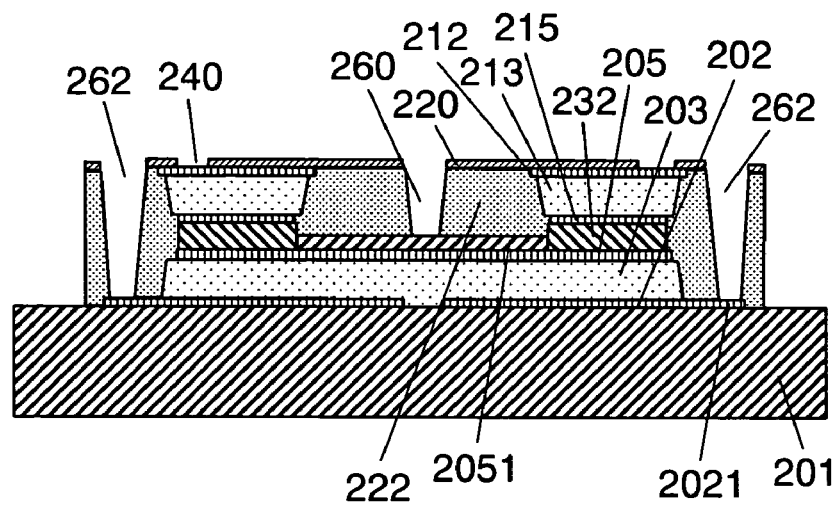
FIG. 13A is a sectional view showing that the first opposite electrode layer and the second opposite electrode layer are joined to each other, the second substrate is removed by etching, and an insulating protective coat is further formed in the manufacturing method.
Figure 13B:
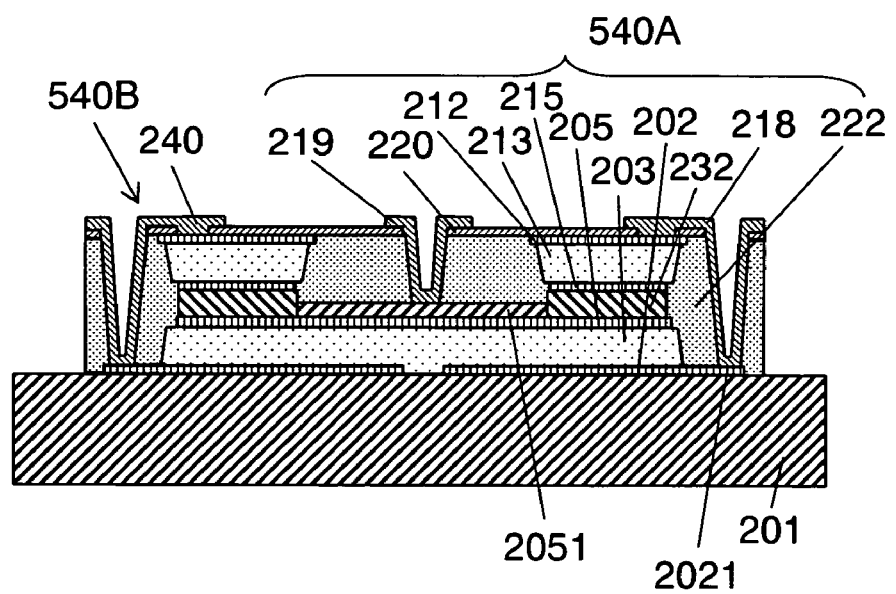
FIG. 13B is a sectional view showing that first connection wirings and a second connection wiring are formed in the manufacturing method.

Next, with reference to FIGS. 13A through 13C, a description is provided of a step in which the first substrate 201 and the second substrate 211 are joined so as to provide thin film piezoelectric element 540.

FIG. 13A shows that the first opposite electrode layer 205 and the second opposite electrode layer 215 are opposed and joined to each other, that second substrate 211 is then removed by etching, and that the insulating protective coat 220 is further formed. Through the insulating protective coat 220, holes 240 are provided in predetermined positions on the second main electrode layer 212. Because the process of forming these shapes is the same as that of the first exemplary embodiment, descriptions thereof are omitted.

In the second exemplary embodiment, the insulating resin layer 222 and the insulating protective coat 220 are also formed on the joint 230 and the first electrode layer projection 2051. Formation of the insulating resin layer 222 and the insulating protective coat 220 in this manner further increases the strength of the joint 203. As a result, when the thin film piezoelectric element 540 of a pair structure is bonded onto a supporting member, breakage of the element is unlikely to occur.

FIG. 13B shows that the first connection wirings 218 and the second connection wiring 219 are formed through the element. In other words, each first connection wiring 218 electrically connects the first main electrode layer projection 2021 and the second main electrode layer 212 via the first opening 262 through the insulating resin layer 222, and also has an electrode pad for an external connection. Similarly, the second connection wiring 219 connects to the first opposite electrode layer projection 2051 via the second opening 260 through the insulating resin layer 222 and the insulating protective coat 220, leads the first opposite electrode layer projection 2051 to the surface, and forms a connection electrode pad. The first connection wirings 218 and the second connection wiring 219 are made by forming a metal thin film by sputtering or evaporation and then by patterning the film by a photolithography process and etching process.

In these steps, a shape of the thin film piezoelectric element 540 is completed although the thin film piezoelectric element 540 is still joined onto the first substrate 201. Thereafter etching out the first substrate 201 can provide the thin film piezoelectric element 540 as being completely separated from the substrate as shown in FIGS. 9 and 10.

In the method of manufacturing the thin film piezoelectric element 540 of the second exemplary embodiment, the first piezoelectric thin film 203 is etched on the first substrate 201 and the second piezoelectric thin film 213 is etched on the second substrate 211 separately. Thus, etching after lamination is performed only on the resin layer made of the insulating resin layer 222 and the insulating protective coat 220. In the conventional method of etching piezoelectric thin films in a laminated state, material remaining on the side walls of the piezoelectric thin film may cause short circuits between the upper and lower electrode layers or a reduction in the width of the pattern. However, in the manufacturing method of the second exemplary embodiment, the respective components are etched separately, and only the resin layer is etched after lamination. Thus, such failures can securely be prevented and yields can be improved considerably.

The thin film piezoelectric thin film 540 can be driven by using three terminals. When the connection electrode pad that is provided on second connection wiring 219 is grounded, a voltage is applied to one of the connection electrode pads that are provided on the first connection wirings 218 and the same voltage of reversed polarity is provided to the other of the connection pads, whereby the operation shown in FIG. 2 can be performed. This simplifies the terminal structure, thus realizing a thin film piezoelectric element having excellent characteristics and a method of manufacturing the element with high yields.

Figure 14:
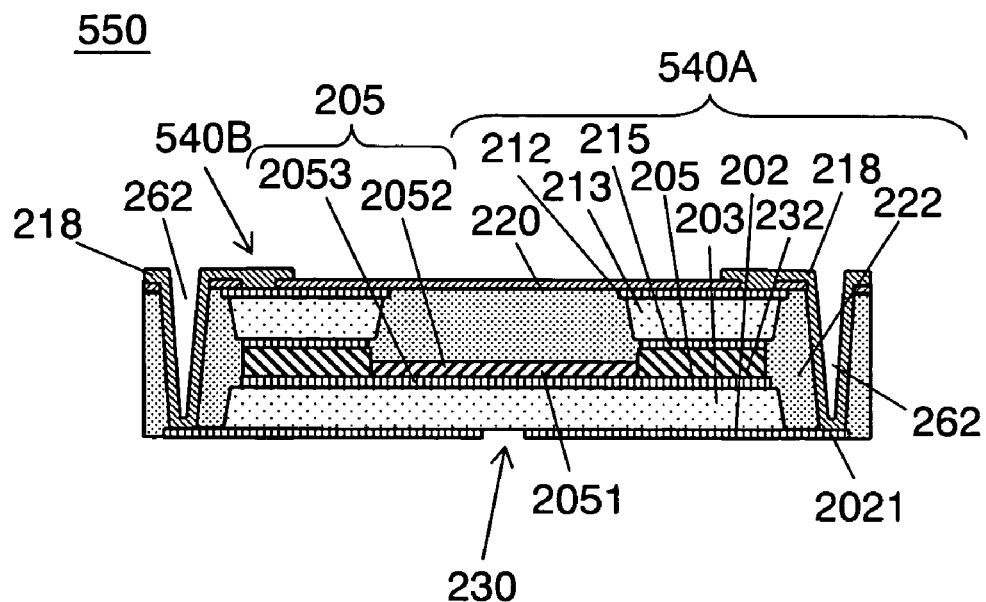
FIG. 14 is a sectional view of a thin film piezoelectric element in accordance with a modification of the second exemplary embodiment of the present invention.

FIG. 14 is a sectional view of a thin film piezoelectric element 550 in accordance with a modification of the second exemplary embodiment. The thin film piezoelectric element 550 of this modification is different from the thin film piezoelectric element 540 in that an opening which is open to first the opposite electrode layer projection 2051 is provided through the insulating resin layer 222 and the insulating protective coat 220. For a thin film piezoelectric element having a pair structure, not only one having a three-terminal structure but also one having a structure of this modification works. The thin film piezoelectric element 550 of this modification has two terminals. However, when voltages of reversed polarity are applied to the terminals without the opposite electrode side grounded, the opposite electrode side is substantially at zero potential and the element performs a similar operation.

The method of manufacturing the thin film piezoelectric element 550 is the same as that of the thin film piezoelectric element 540, except that the second opening 260 and the second connection wiring 219 are not formed.

Third Exemplary Embodiment

Figure 15:
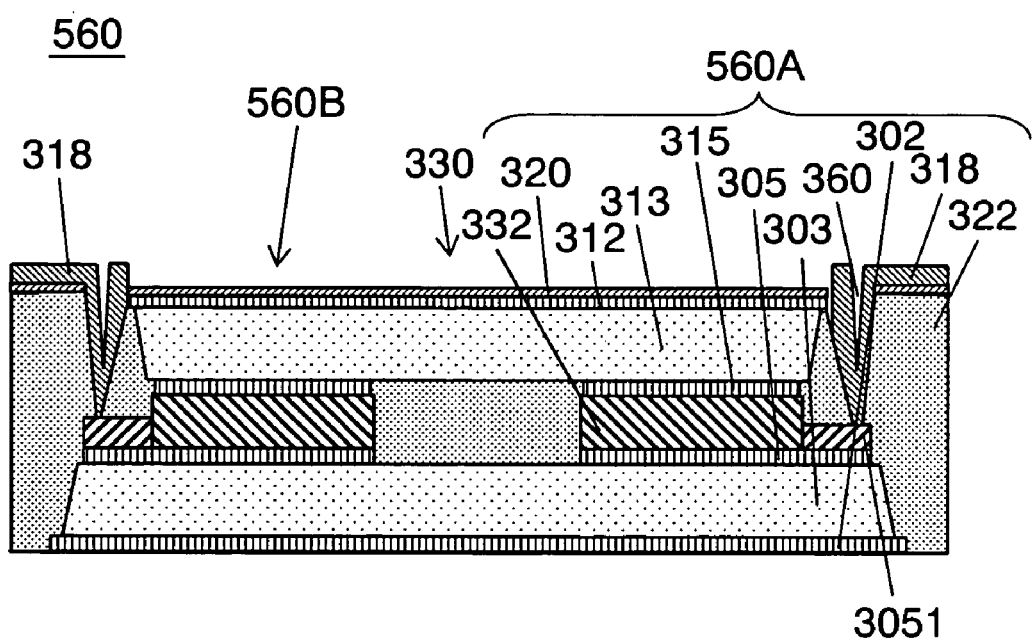
FIG. 15 is a sectional view of an electrode leading area of a thin film piezoelectric element in accordance with a third exemplary embodiment of the present invention.

FIG. 15 is a sectional view of an electrode leading area of a thin film piezoelectric element 560 in accordance with a third exemplary embodiment of the present invention. The thin film piezoelectric element 560 of the third exemplary embodiment also has a pair structure. The structure of a piezoelectric function area of each of the element parts 560A and 560B is the same as that of the thin film piezoelectric element 540 of the second exemplary embodiment.

In other words, the piezoelectric function area of each of the element parts 560A and 560B is structured so that a first piezoelectric thin film 303, which is sandwiched (disposed) between a first main electrode layer 302 and a first opposite electrode layer 305, and a second piezoelectric thin film 313, which is sandwiched (disposed) between a second main electrode layer 312 and the second opposite electrode layer 315, are coupled with the first opposite electrode layer 305 and a second opposite electrode layer 315 physically and are electrically connected to each other via a conductive adhesive layer 332. The outer periphery of the thin film piezoelectric element 560 is protected by insulating layer 322 of the same thickness. An insulating protective coat 320 is formed on the insulating layer 322 and the second main electrode layer 312. Also in the third exemplary embodiment, because the insulating layer 322 is made of a resin material, the insulating material 322 is hereinafter referred to as an insulating resin layer 322.

In the thin film piezoelectric element 560 of the third exemplary embodiment, the structure of an electrode leading area is different from that of the thin film piezoelectric element 540 of the second exemplary embodiment. The difference is mainly described hereinafter.

In the electrode leading area, the first main electrode layer 302, the first piezoelectric thin film 303, the second main electrode layer 312, and the second piezoelectric thin film 313 are coupled so as to form a joint 330. The gap in the joint 330 that is defined by the first opposite electrode layer 305, the conductive adhesive layer 332, and the second opposite electrode layer 315 is filled with the insulating resin layer 322.

The joint 330 couples the two element parts 560A and 560B into an integrated structure. Additionally, the first main electrode layers 302 and the second main electrode layers 312 of the respective element parts 560A and 560B are coupled with each other. As a result, the first main electrode layers 302 are electrically connected with each other, and the second main electrode layers 312 are electrically connected with each other.

Further, a connection wiring 318 is formed from the first opposite layer projection 3051 extending from the first opposite electrode 305 of each of the element parts 560A and 560B, via a second opening 360 through the insulating resin layer 322 and the insulating protective coat 320. Connection electrode pads are provided on the connection wirings 318.

As described above, for the thin film piezoelectric element 560 of the third exemplary embodiment, connection electrode pads from the connection wirings 318 are connected only to the electrode pads for the piezoelectric element on the flexure. The total number of connection electrode pads is only two, one from each of the element parts 560A and 560B.

Also in the third exemplary embodiment, an Au layer is formed as an upper layer 3052 on the surface of the first opposite electrode layer 305 and a Sn layer is formed as an upper layer 3151 on the second opposite electrode layer 315. The upper layers 3052 and 3151 are brought into intimate contact with each other, and are heated to temperatures at which an Au—Sn eutectic reaction occurs so as to melt and form adhesive layer 332.

Hereinafter, a description is provided of a method of manufacturing the thin film piezoelectric element 560 of the third exemplary embodiment. Also in the third exemplary embodiment, the descriptions are provided with reference to a sectional shape of the electrode leading area.

Figure 16A:
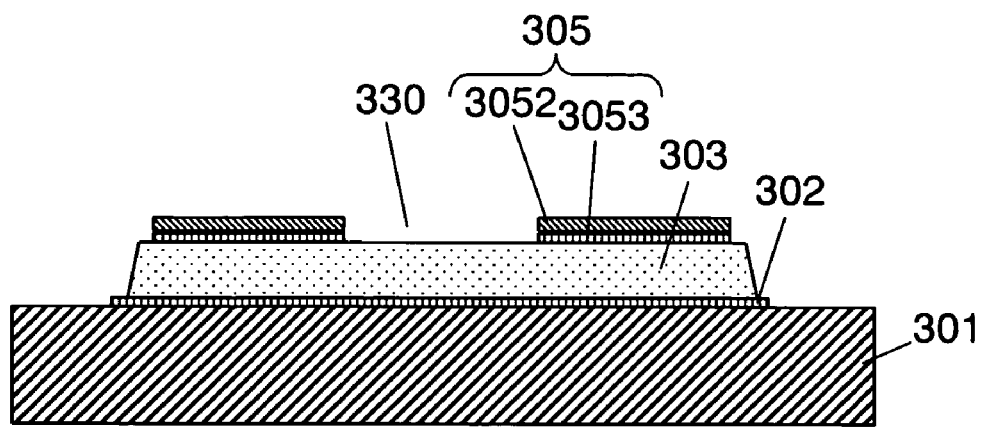
FIG. 16A is a sectional view showing that a first main electrode layer, a first piezoelectric thin film, and a first opposite electrode layer are laminated on a first substrate to form predetermined patterns, in a method of manufacturing a thin film piezoelectric element in accordance with the third exemplary embodiment.
Figure 16B:
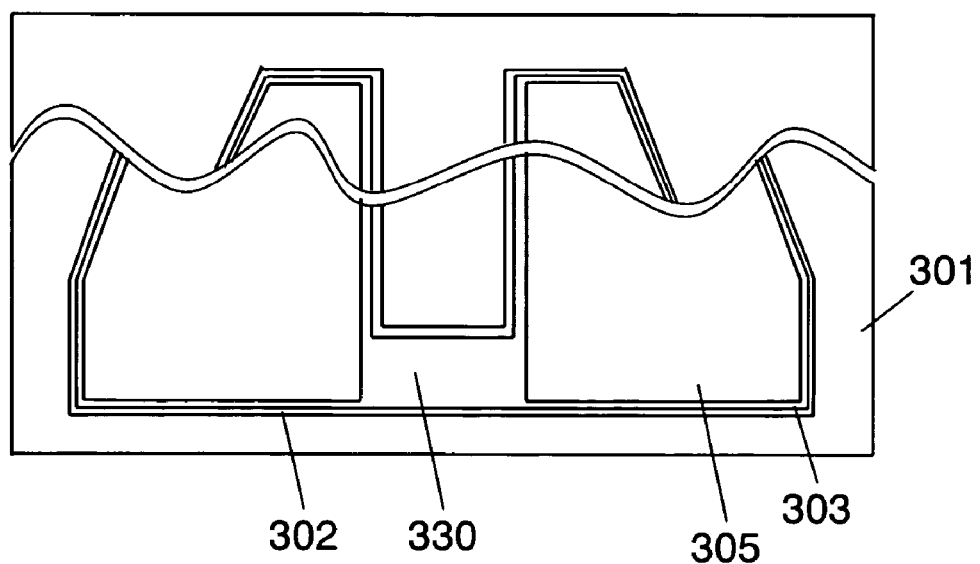
FIG. 16B is a plan view of a shape shown in FIG. 16A.

FIG. 16A is a sectional view showing that the first main electrode layer 302, the first piezoelectric thin film 303, and the first opposite electrode layer 305 are laminated on the first substrate 301 and that predetermined patterns are formed. FIG. 16B is a plan view thereof.

As is obvious from FIG. 16B, in the piezoelectric function area, the first main electrode layer 302, the first piezoelectric thin film 303 and the first opposite electrode layer 305 are analogous and structured to be laminated similar to the steps from the side of the first substrate 301. This shape is the same as that of the first and second exemplary embodiments.

In the electrode leading area, the first main electrode layer 302 and the first piezoelectric thin film 303 are also formed in the joint 330. The joint 330 couples the patterns on both sides. The first opposite electrode layer 305 is formed only on the surface of the first piezoelectric thin film 303 other than joint 330.

Further, also in the third exemplary embodiment, the first opposite electrode layer 305 has a multi-layer structure. The upper layer 3052 is made of gold (Au), and a Pt layer is used as lower layer 3053 similar to the first main electrode layer 302. For the lower layer 3053, the same material can be selected as for the first main electrode layer 302 as is required. Even with the first opposite electrode layer 305 having such a multi-layer structure, a predetermined pattern can be formed easily by general techniques for the photolithography process and etching process.

Figure 17A:
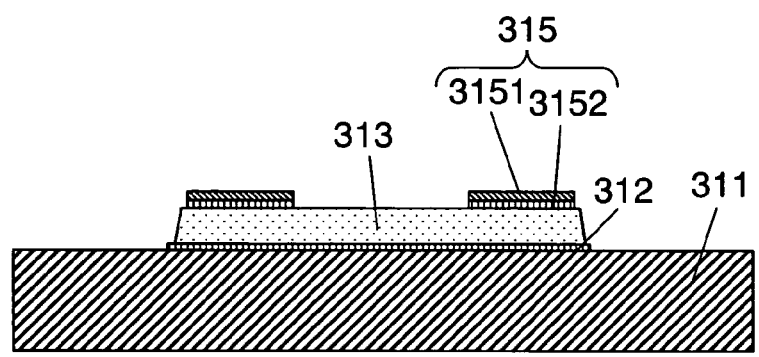
FIG. 17A is a sectional view showing that a second main electrode layer, a second piezoelectric thin film, and a second opposite electrode layer are laminated on a second substrate in the method of manufacturing a thin film piezoelectric element in accordance with the third exemplary embodiment.
Figure 17B:
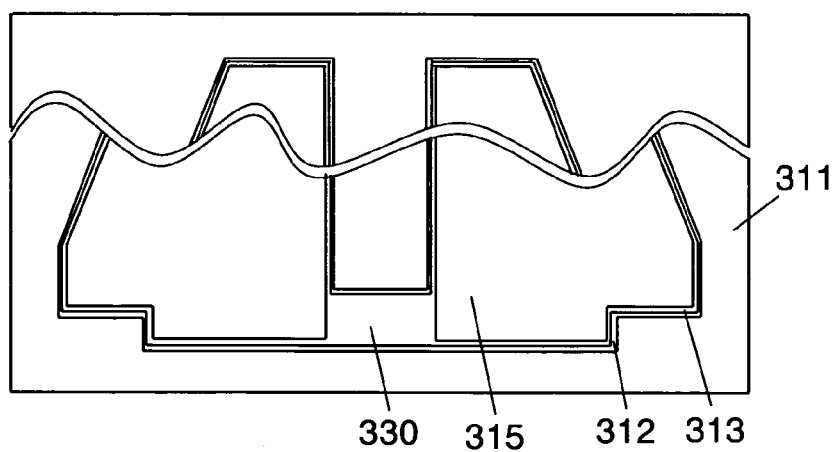
FIG. 17B is a plan view of a shape shown in FIG. 17A.

FIG. 17A is a sectional view showing that the second main electrode layer 312, the second piezoelectric thin film 313, and the second opposite electrode layer 315 are formed on a second substrate 311. FIG. 17B is a plan view thereof.

These patterns on the second substrate 311 are the same as the patterns on the first substrate 301 except for the electrode leading area. In the joint 330 in the electrode leading area, the second main electrode layer 312 and the second piezoelectric thin film 313 are formed to couple the patterns on both sides. On each of the outer peripheral sides in the electrode leading area, the second main electrode layer 312, the second piezoelectric thin film 313 and the second opposite electrode layer 315 are partially notched to be narrower than first opposite electrode layer 305. For this reason, as shown in FIG. 15, when the first opposite electrode layer 305 and the second opposite electrode layer 315 are joined, the first opposite electrode layer 305 in these notched areas is exposed so as to form first opposite electrode layer projections 3051. In contrast, on each of the inner peripheral sides, the shape of the layers on the second substrate 311 corresponds to the shape of the layers on first substrate 301.

The second opposite electrode layer 315 also has a multi-layer structure. The upper layer 3151 is made of tin (Sn) and a Pt layer is used as the lower layer 3152.

The same material can be used for the second substrate 311 as is used for the first substrate 301. Further, for the second main electrode layer 312 and the second piezoelectric thin film 313 that are formed on the second substrate 311, the same materials of the films on the first substrate 301 and the method of forming them can be used. These descriptions are omitted because they are the same as those described with respect to the first exemplary embodiment.

Figure 18A:
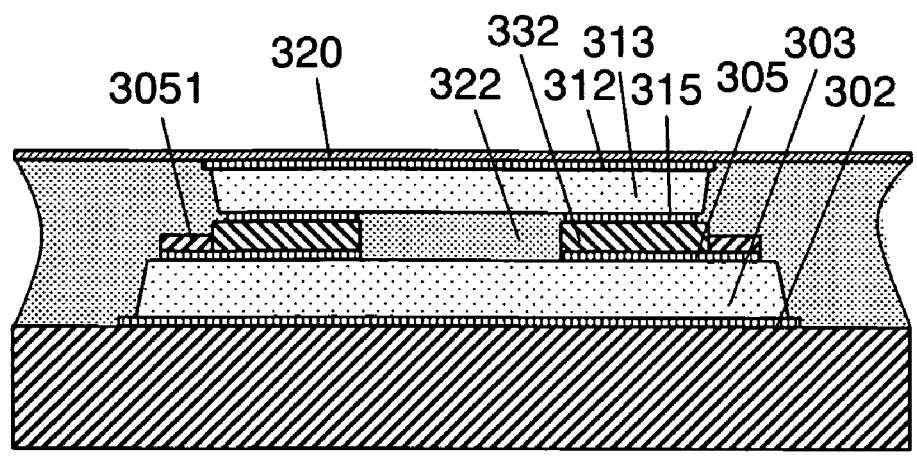
FIG. 18A is a sectional view showing that the first opposite electrode layer and the second opposite electrode layer are brought into opposite intimate contact with and joined to each other, the second substrate is removed by etching, and an insulating protective coat is formed on a exposed surface in the method of manufacturing a thin film piezoelectric element in accordance with the third exemplary embodiment.

FIG. 18A is a sectional view showing that the first opposite electrode layer 305 and the second opposite electrode layer 315 are opposed and joined to each other, that the second substrate 311 is then etched out, and that the insulating protective coat 320 is formed on the exposed surface.

As is obvious from the drawing, the insulating resin layer 322 is also formed in the gap in the joint 330 that is sandwiched between the first piezoelectric thin film 303 and the second piezoelectric thin film 313. Additionally, the insulating resin layer 322 is formed so as to cover the outer periphery including the first opposite electrode layer projections 3051 that are provided on the outer peripheral sides.

Because the insulating resin layer 322, the first main electrode layer 302, the first piezoelectric thin film 303, the second piezoelectric thin film 313 and the second main electrode layer 312 are formed in the joint 330 in this manner, the strength of joint 330 is further increased. This structure can prevent breakage of the thin film piezoelectric element 560 of a pair structure during handling.

Figure 18B:
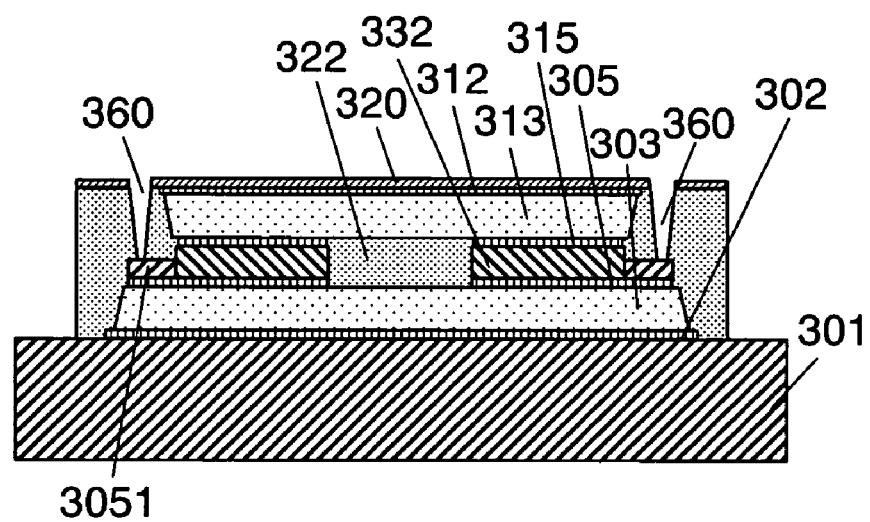
FIG. 18B is a sectional view showing that the insulating protective coat and an insulating resin layer are etched in the method of manufacturing a thin film piezoelectric element in accordance with the third exemplary embodiment.

FIG. 18B is a sectional view showing that the insulating protective coat 320 and the insulating resin layer 322 are etched. Similar to the first and second exemplary embodiments, the pattern of this etching is wider than the first main electrode layer 302. Second openings 360 are also formed through the insulating resin layer 322 on the first opposite electrode layer projections 3051. These steps can be performed by etching the resin layer made of the insulating protective coat 320 and the insulating resin layer 322. Thus, the processing can easily be performed with high accuracy.

Thereafter, connection wirings 318, which are each for connecting to the first opposite electrode layer projection 3051, are formed via the second openings 360. In these steps, a shape of the thin film piezoelectric element 560 is completed although the thin film piezoelectric element 560 is still joined onto the first substrate 301. Thereafter, etching out the first substrate 301 can provide the thin film piezoelectric element 560 being completely separated from the substrate as shown in FIG. 15.

In the method of manufacturing the thin film piezoelectric element 560 of the third exemplary embodiment, the first piezoelectric thin film 303 is etched on the first substrate 301, and the second piezoelectric thin film 313 is etched on the second substrate 311 separately. Thus, etching after lamination is performed only on the resin layer that is made of the insulating resin layer 322 and the insulating protective coat 320. In the conventional method of etching piezoelectric thin films in a laminated state, material remaining on the side walls of the piezoelectric thin film may cause short circuits between the upper and lower electrode layers or a reduction in the width of the pattern. However, in the manufacturing method of the third exemplary embodiment, the respective components are etched separately, and only the resin layer is etched after lamination. Thus, such failures can be securely prevented and yields can be improved considerably.

The thin film piezoelectric element 560 can be driven by using two terminals. When voltages of reversed polarity are applied to the connection electrode pads that are provided on connection wirings 318, the operation shown in FIG. 2 can be performed. When such voltages are applied, the opposite electrode side is substantially at zero potential, and the thin film piezoelectric element 560 performs expansion and contraction movements even without being grounded.

The method of manufacturing the thin film piezoelectric element 560 simplifies the patterning process and the structure of the terminals, thus providing excellent characteristics and improving yields.

In the third exemplary embodiment, the insulating resin layer 322 is also formed in the gap in the joint 330 that is sandwiched between the first piezoelectric thin film 303 and the second piezoelectric thin film 313. However, the first opposite electrode layer 305 and the second opposite electrode layer 315 can be formed and joined, and the adhesive layer 332 can be provided in this region.

In the first through third exemplary embodiments, descriptions are provided of a thin film piezoelectric element having a pair structure. However, the present invention is not limited to this structure. Only one element part of the thin film piezoelectric element described in the first embodiment can be used as a thin film piezoelectric element.

Further, the opening that is formed in an insulating layer is not limited to a via-hole. Unless the connection wiring is in contact with the piezoelectric thin films, opposite electrode layers or other components, no restrictions are imposed on the shape of the opening.

In the first through third exemplary embodiments, as a thin film piezoelectric element having a pair structure and symmetrical mirror images, each element part is pentagonal. The present invention is not limited to this shape. For example, a rectangular shape or triangular shape can be used.

In the first through third exemplary embodiments, the first opposite electrode layer and the second opposite electrode layer are joined by using a conductive adhesive layer. The first and second opposite electrode layers can be joined by ultrasonic bonding or heat welding, for example. Alternatively, a conductive adhesive can be used. Additionally, a physical and electrical connection therebetween does not need to be provided on the entire surface.

What is claimed is:

1. A thin film piezoelectric element comprising a structure and an insulating layer covering an outer periphery of said structure along a thickness of said structure, wherein:

said structure comprises
  a first main electrode layer and a first opposite electrode layer,
  a first piezoelectric thin film disposed between said first main electrode layer and said first opposite electrode layer,
  a second main electrode layer and a second opposite electrode layer, and
  a second piezoelectric thin film disposed between said second main electrode layer and said second opposite electrode layer;

said first piezoelectric thin film and said second piezoelectric thin film being coupled so that said first opposite electrode layer and said second opposite electrode layer are opposed to each other and are physically and electrically connected to each other;

said first main electrode layer includes a first main electrode layer projection partially extending from said first piezoelectric thin film;

a first opening is formed through said insulating layer and said first main electrode layer projection; and a first connection wiring for connecting said first main electrode layer projection and said second main electrode layer is disposed via said first opening.

2. The thin film piezoelectric element according to claim 1, wherein said first connection wiring is disposed on a front surface of said second main electrode layer.

3. The thin film piezoelectric element according to claim 1, further comprising a conductive adhesive layer, and wherein said first opposite electrode layer and said second opposite electrode layer are structured so as to be physically and electrically connected to each other by said conductive adhesive layer.

4. The thin film piezoelectric element according to claim 3, wherein each of said first opposite electrode layer and said second opposite electrode layer is made of at least two layers, a combination of materials of upper layers of said first opposite electrode and said second opposite electrode is arbitrarily selected from a first group consisting of Au, Ag and Cu, and a second group consisting of Sn, Cd, Au-containing Sn alloys and Au-containing Cd alloys, and said conductive adhesive layer is made by alloying the upper layers with each other.

5. The thin film piezoelectric element according to claim 3, wherein each of said first opposite electrode layer and said second opposite electrode layer is made of at least two layers, each upper layer of said first opposite electrode layer and said second opposite electrode layer is made of solder, and said conductive adhesive layer is made by melting the upper layers of said first opposite electrode layer and said second opposite electrode layer into one.

6. The thin film piezoelectric element according to claim 3, wherein each of said first opposite electrode layer and said second opposite electrode layer is made of at least two layers, an upper layer of the at least two layers of said first opposite electrode layer and said second opposite electrode layer is made of solder and the other upper layer of the at least two layers of said first opposite electrode layer and said second opposite electrode layer is made of at least one material of the solder, and said conductive adhesive layer is made by melting the upper layers of said first opposite electrode layer and said second opposite electrode layer into one.

7. The thin film piezoelectric element according to claim 3, wherein said conductive adhesive layer is made of an adhesive comprising at least one of a resin paste and a conductive polymer including a conductive particle and an adhesive binder.

8. A thin film piezoelectric element comprising a structure having an electrode leading area, and an insulating layer covering an outer periphery of said structure along a thickness of said structure, wherein:

said structure comprises a first main electrode layer and a first opposite electrode layer, a first piezoelectric thin film disposed between said first main electrode layer and said first opposite electrode layer, a second main electrode layer and a second opposite electrode layer, and a second piezoelectric thin film disposed between said second main electrode layer and said second opposite electrode layer;

said first piezoelectric thin film and said second piezoelectric thin film being coupled so that said first opposite electrode layer and said second opposite electrode layer are opposed to each other and are physically and electrically connected to each other;

said first main electrode layer in said electrode leading area includes a first main electrode layer projection partially extending from said first piezoelectric thin film;

a first connection wiring for connecting said first main electrode layer projection and said second main electrode layer is disposed via a first opening that is formed through said insulating layer on said first main electrode layer projection; and said second main electrode layer, said second piezoelectric thin film and said second opposite electrode layer in said electrode leading area are formed narrower than said first opposite electrode layer so as to provide a region in which said insulating layer is provided on said first opposite electrode layer; and a second connection wiring for establishing an electrical connection to said first opposite electrode layer is disposed via a second opening that is formed through said insulating layer on said first opposite electrode layer in the region.

9. The thin film piezoelectric element according to claim 8, wherein said first connection wiring and said second connection wiring are structured so as to extend to a same front surface of said second main electrode of said structure.

10. The thin film piezoelectric element according to claim 8, further comprising a conductive adhesive layer, and wherein said first opposite electrode layer and said second opposite electrode layer are structured so as to be physically and electrically connected to each other by said conductive adhesive layer.

11. The thin film piezoelectric element according to claim 10, wherein each of said first opposite electrode layer and said second opposite electrode layer is made of at least two layers, a combination of materials of upper layers of said first opposite electrode and said second opposite electrode is arbitrarily selected from a first group consisting of Au, Ag and Cu, and a second group consisting of Sn, Cd, Au-containing Sn alloys and Au-containing Cd alloys, and said conductive adhesive layer is made by alloying the upper layers with each other.

12. The thin film piezoelectric element according to claim 10, wherein each of said first opposite electrode layer and said second opposite electrode layer is made of at least two layers, each upper layer of said first opposite electrode layer and said second opposite electrode layer is made of solder, and said conductive adhesive layer is made by melting the upper layers of said first opposite electrode layer and said second opposite electrode layer into one.

13. The thin film piezoelectric element according to claim 10, wherein each of said first opposite electrode layer and said second opposite electrode layer is made of at least two layers, an upper layer of the at least two layers of said first opposite electrode layer and said second opposite electrode layer is made of solder and the other upper layer of the at least two layers of said first opposite electrode layer and said second opposite electrode layer is made of at least one material of the solder, and said conductive adhesive layer is made by melting the upper layers of said first opposite electrode layer and said second opposite electrode layer into one.

14. The thin film piezoelectric element according to claim 10, wherein the conductive adhesive layer is made of an adhesive comprising one of resin paste and conductive polymer including a conductive particle and an adhesive binder.

15. A thin film piezoelectric element comprising:
a pair of element parts disposed in a plane with a predetermined space held therebetween;
a piezoelectric function area operating as a piezoelectric body of the pair of said element parts having mirror images symmetrical with respect to a centerline of the predetermined space;
a joint for coupling said element parts in a part of the predetermined space using at least one kind of material comprising said element parts; wherein:
each of the pair of said element parts comprises a structure having an electrode leading area, and an insulating layer covering an outer periphery of said structure along a thickness of said structure, said structure of each of the pair of said element parts comprising
a first main electrode layer and a first opposite electrode layer,
a first piezoelectric thin film disposed between said first main electrode layer and said first opposite electrode layer,
a second main electrode layer and a second opposite electrode layer, and
a second piezoelectric thin film disposed between said second main electrode layer and said second opposite electrode layer;
said first main electrode layer in said electrode leading area includes a first main electrode layer projection partially extending from said first piezoelectric thin film;
said second main electrode layer, said second piezoelectric thin film, and said second opposite electrode layer in said electrode leading area are formed narrower than said first opposite electrode layer so as to provide a region in which said insulating layer is provided on said first opposite electrode layer;
at least one of a first opening formed through said insulating layer on said first main electrode layer projection and a second opening formed through said insulating layer on said first opposite electrode layer in the region; and
a connection wiring connecting to one of said first opposite electrode layer and said first main electrode layer and leading to a surface layer via one of said first opening and said second opening.

16. The thin film piezoelectric element according to claim 15, further comprising a conductive adhesive layer, and
wherein said first opposite electrode layer and said second opposite electrode layer are structured so as to be physically and electrically connected to each other by said conductive adhesive layer.

17. The thin film piezoelectric element according to claim 16, wherein each of said first opposite electrode layer and said second opposite electrode layer is made of at least two layers,
a combination of materials of upper layers of said first opposite electrode and said second opposite electrode is arbitrarily selected from a first group consisting of Au, Ag and Cu, and a second group consisting of Sn, Cd, Au-containing Sn alloys and Au-containing Cd alloys, and said conductive adhesive layer is made by alloying the upper layers with each other.

18. The thin film piezoelectric element according to claim 16, wherein each of said first opposite electrode layer and said second opposite electrode layer is made of at least two layers, each upper layer of said first opposite electrode layer and said second opposite electrode layer is made of solder, and said conductive adhesive layer is made by melting the upper layers of said first opposite electrode layer and said second opposite electrode layer into one.

19. The thin film piezoelectric element according to claim 16, wherein each of said first opposite electrode layer and said second opposite electrode layer is made of at least two layers, an upper layer of the at least two layers of said first opposite electrode layer and said second opposite electrode layer is made of solder and the other upper layer of the at least two layers of said first opposite electrode layer and said second opposite electrode layer is made of at least one material of the solder, and said conductive adhesive layer is made by melting the upper layers of said first opposite electrode layer and said second opposite electrode layer into one.

20. The thin film piezoelectric element according to claim 16, wherein said conductive adhesive layer is made of an adhesive comprising one of resin paste and conductive polymer including a conductive particle and an adhesive binder.

21. The thin film piezoelectric element according to claim 15, wherein:
said joint is formed of said insulating layer;
said structure has said first opening and said second opening formed therein; and
said connection wiring comprises
a first connection wiring for connecting said first main electrode layer projection and said second main electrode layer via said first opening, and
a second connection wiring for connecting to said first opposite electrode layer and leading to the surface layer via said second opening.

22. The thin film piezoelectric element according to claim 15, wherein:
said joint is formed of at least said first opposite electrode layer and said first piezoelectric thin film;
said structure has said first opening and said second opening common to said element parts; and
said connection wiring comprises
a first connection wiring for connecting said first main electrode layer projection and said second main electrode layer via said first opening; and
a second connection wiring for connecting to said first opposite electrode layer and leading to the surface layer via said second opening.

23. The thin film piezoelectric element according to claim 15, wherein:
said joint is formed of at least said first opposite electrode layer and said first piezoelectric thin film;
said structure has said first opening formed through said insulating layer on said first main electrode layer projection; and
said connection wiring connects said first main electrode layer projection and said second main electrode layer via said first opening.

24. The thin film piezoelectric element according to claim 15, wherein:
said joint is formed of said first main electrode layer, said first piezoelectric thin film, said second main electrode layer, and said second piezoelectric thin film;
said structure has said second opening formed through said insulating layer on said first opposite electrode layer projection; and said connection wiring for connecting to said first opposite electrode layer projection and leading to the surface layer is formed via said second opening.

25. An actuator comprising:

a supporting member; and said pair of thin film piezoelectric elements according to claim 15 being disposed on said supporting member, wherein said pair of thin film piezoelectric elements are operable to expand and contract in directions opposite to each other.

26. A disk drive comprising:

a disk-shaped record medium;

a head for performing at least one of recording and reproducing operations on said record medium;

a first positioning means and a second positioning means for positioning said head in a specific position on said record medium; and said actuator according to claim 25, said actuator comprising a supporting member having said head mounted thereon;

wherein said first positioning means is a driving means for rotating an arm which holds said supporting member, and said second positioning means is said actuator comprising said supporting member and a pair of thin film piezoelectric elements attached to said supporting member.

* * * * *